US012771307B2

(12) United States Patent
Yamaguchi et al.

(10) Patent No.: US 12,771,307 B2
(45) Date of Patent: Oct. 20, 2026

(54) METHOD FOR MANUFACTURING VIBRATOR ELEMENT

(71) Applicant: SEIKO EPSON CORPORATION, Tokyo (JP)

(72) Inventors: Keiichi Yamaguchi, Ina (JP); Hiyori Sakata, Shinagawa (JP); Shigeru Shiraishi, Ina (JP); Ryuta Nishizawa, Nagano (JP)

(73) Assignee: SEIKO EPSON CORPORATION (JP)

( * ) Notice: Subject to any disclaimer, the term of this patent is extended or adjusted under 35 U.S.C. 154(b) by 710 days.

(21) Appl. No.: 18/072,988

(22) Filed: Dec. 1, 2022

(65) Prior Publication Data

US 2023/0179164 A1 Jun. 8, 2023

(30) Foreign Application Priority Data

Dec. 2, 2021 (JP) ................................ 2021-195914

(51) Int. Cl.
*H03H 3/02* (2006.01)
*H03H 9/215* (2006.01)

(52) U.S. Cl.
CPC .............. *H03H 3/02* (2013.01); *H03H 9/215* (2013.01); *H03H 2003/026* (2013.01)

(58) Field of Classification Search
CPC ........ H10N 30/082; H10N 30/06; H03H 9/21; H03H 9/215; H03H 2003/026; H03H 3/02
See application file for complete search history.

(56) References Cited

U.S. PATENT DOCUMENTS 4,472,654 A * 9/1984 Nakamura ............... H03H 9/21 310/312
6,046,531 A * 4/2000 Kikuchi ............. G01C 19/5621 73/504.03
(Continued)

FOREIGN PATENT DOCUMENTS

JP 2007-013382 A 1/2007
JP 2007329879 A * 12/2007
(Continued)

OTHER PUBLICATIONS

Translation of JP-2007329879-A (Year: 2007).*
Translation of JP-2010227817-A (Year: 2010).*
Translation of WO-2006030900-A1 (Year: 2006).*

*Primary Examiner* — Jeffrey T Carley
(74) *Attorney, Agent, or Firm* — Harness, Dickey & Pierce, P.L.C.

(57) ABSTRACT

A method for manufacturing a vibrator element includes a first protective film forming step of forming a first protective film on a first substrate surface of a quartz crystal substrate, a first dry etching step of dry etching the quartz crystal substrate from a first substrate surface side to form a first groove and outer shapes of a first and second vibration arms, a second protective film forming step of forming a second protective film on a second substrate surface of the quartz crystal substrate, and a second dry etching step of dry etching the quartz crystal substrate from a second substrate surface side to form a second groove and outer shapes of the first and second vibration arms. In the first dry etching step, the outer shapes of the first and second vibration arms are formed to be closer to the second substrate surface than is a position where a bottom surface of the second groove is formed.

7 Claims, 26 Drawing Sheets

(56) References Cited

U.S. PATENT DOCUMENTS 6,881,649 B2 * 4/2005 Kouma .............. G02B 26/0841 438/460
7,482,277 B2 * 1/2009 Barwicz ............ H01L 21/76813 438/720
7,553,609 B2 * 6/2009 Aratake ............... H03H 9/0595 430/318
7,861,387 B2 * 1/2011 Hokibara ................ C03C 15/00 430/314
7,948,156 B2 * 5/2011 Satoh ....................... H03H 9/21 310/365
8,134,284 B2 * 3/2012 Kawanishi ........... H03H 9/1021 310/370
8,156,621 B2 * 4/2012 Iwai .......................... C23F 1/14 29/25.35
8,174,171 B2 * 5/2012 Iwai ....................... H03H 9/215 310/370
8,183,743 B2 * 5/2012 Petrenko ................ H02N 2/002 310/317
8,365,371 B2 * 2/2013 Amano .................. H10N 30/06 29/25.35
8,373,333 B2 * 2/2013 Yamada ............. H03H 9/02062 310/368
8,400,048 B2 * 3/2013 Shirai ...................... H03H 9/21 73/504.16
8,580,126 B2 * 11/2013 Sasaki .................. H03H 9/1014 216/2
10,072,928 B2 * 9/2018 Ishii ..................... H10N 30/302
10,447,237 B2 * 10/2019 Oga ......................... H03H 9/10
10,748,777 B2 * 8/2020 Eom ..................... G02F 1/1345
11,584,641 B2 * 2/2023 Tani ...................... G01P 15/131
12,078,813 B2 * 9/2024 Ochiai ............... G02B 27/0994
12,213,381 B2 * 1/2025 Sakata ..................... H03H 9/19
2003/0071542 A1 * 4/2003 Satoh ....................... H03H 3/08 310/367
2005/0116586 A1 * 6/2005 Tanaya ..................... H03H 9/21 310/348
2008/0179998 A1 * 7/2008 Kawashima ............. H03H 9/21 29/25.35
2008/0209703 A1 9/2008 Iwai
2009/0152994 A1 * 6/2009 Numata ............... H03H 9/1021 29/25.35
2009/0206704 A1 * 8/2009 Kitamura ............. H03H 9/0547 310/357
2009/0289531 A1 * 11/2009 Fang ........................ H03H 9/21 310/370
2011/0068876 A1 * 3/2011 Yamada ............... H03H 9/1021 331/158
2017/0126200 A1 * 5/2017 Matsuo .................... H03H 3/02
2019/0074812 A1 * 3/2019 Inoue .................... B81B 3/0072

FOREIGN PATENT DOCUMENTS

JP 2008-205657 A 9/2008
JP 2010227817 A * 10/2010 ............. H10N 30/06
JP 2013-175933 A 9/2013
JP 2018-148380 A 9/2018
WO WO-2006030900 A1 * 3/2006 ............... H03H 3/04

* cited by examiner

METHOD FOR MANUFACTURING VIBRATOR ELEMENT

The present application is based on, and claims priority from JP Application Serial Number 2021-195914, filed Dec. 2, 2021, the disclosure of which is hereby incorporated by reference herein in its entirety.

BACKGROUND

1. Technical Field

The present disclosure relates to a method for manufacturing a vibrator element.

2. Related Art

JP-A-2013-175933 discloses a method for forming a tuning fork type vibrator having a bottomed groove in a vibration arm by wet etching and dry etching. In this manufacturing method, a quartz crystal substrate is wet etched to form an outer shape of the tuning fork type vibrator, and then the groove is formed by dry etching.

JP-A-2007-013382 discloses a method for forming a tuning fork type vibrator having a bottomed groove in a vibration arm by dry etching. In this manufacturing method, when a substrate made of a piezoelectric material is dry etched, a width of the groove is narrowed relative to a width between a pair of vibration arms, thereby using a micro loading effect to make an etching depth of the groove smaller than an etching depth between the pair of vibration arms, the groove and an outer shape of the vibrator are collectively formed.

In the manufacturing method disclosed in JP-A-2013-175933, since wet etching for forming the outer shape and dry etching for forming the groove are separate steps, manufacturing steps are complicated, and misalignment of the groove relative to the outer shape is likely to occur. Therefore, there is a problem in that a vibrator element manufactured by this manufacturing method is likely to generate an unnecessary vibration.

On the other hand, in the manufacturing method disclosed in JP-A-2007-013382, since the outer shape and the groove are collectively formed in the same step, the above-described problem does not occur. However, in this manufacturing method, since the outer shape and the groove are collectively formed using the micro loading effect in dry etching, there is a problem in that setting of a dimension such as a width of the vibration arm and a width and a depth of the groove is restricted, which leads to a low degree of freedom in design.

Therefore, there is a demand for a method for manufacturing a vibrator element in which an outer shape and a groove can be collectively formed and that has a high degree of freedom in design.

SUMMARY

A method for manufacturing a vibrator element which includes a first vibration arm and a second vibration arm that extend along a first direction and that are arranged side by side along a second direction intersecting the first direction, and in which the first vibration arm and the second vibration arm each have a first surface and a second surface that are arranged side by side in a third direction intersecting the first direction and the second direction and that are in a front and back relationship, a bottomed first groove that opens to the first surface, and a bottomed second groove that opens to the second surface, includes: a preparation step of preparing a quartz crystal substrate having a first substrate surface and a second substrate surface that are in a front and back relationship; a first protective film forming step of forming a first protective film on the first substrate surface; a first dry etching step of dry etching the quartz crystal substrate from a first substrate surface side via the first protective film to form the first surface, the first groove, and outer shapes of the first vibration arm and the second vibration arm; a second protective film forming step of forming a second protective film on the second substrate surface; and a second dry etching step of dry etching the quartz crystal substrate from a second substrate surface side via the second protective film to form the second surface, the second groove, and outer shapes of the first vibration arm and the second vibration arm, and in the first dry etching step, the outer shapes of the first vibration arm and the second vibration arm are formed to be closer to the second substrate surface in the third direction than a position where a bottom surface of the second groove is formed.

DESCRIPTION OF EXEMPLARY EMBODIMENTS

Next, embodiments of the present disclosure will be described with reference to the drawings.

For convenience of description, in drawings except for FIGS. 3, 6, 10, 16, and 26, an X axis, a Y axis, and a Z axis are shown as three axes orthogonal to one another. A direction along the X axis is referred to as an “X direction”, a direction along the Y axis is referred to as a “Y direction”, and a direction along the Z axis is referred to as a “Z direction”. In addition, an arrow tip side in each axial direction is referred to as a “positive side”, and an arrow base end side is referred to as a “negative side”. For example, the Y direction refers to both the positive side in the Y direction and the negative side in the Y direction. A positive side in the Z direction is referred to as “upper”, and a negative side in the Z direction is referred to as “lower”. A plan view from the Z direction is also simply referred to as a “plan view”. A thickness along the Z direction is also simply referred to as a “thickness”. The Y direction is also referred to as a “first direction”, the X direction is also referred to as a “second direction”, and the Z direction is also referred to as a “third direction”. In the present embodiment, the X axis, the Y axis, and the Z axis correspond to crystallographic axes of quartz crystal which will be described later.

1. First Embodiment

A method for manufacturing a vibrator element 1 according to a first embodiment will be described.

First, a configuration of the vibrator element 1 will be described with reference to FIGS. 1 and 2, and then a method for manufacturing the vibrator element 1 will be described with reference to FIGS. 3 to 13.

Figure 1:
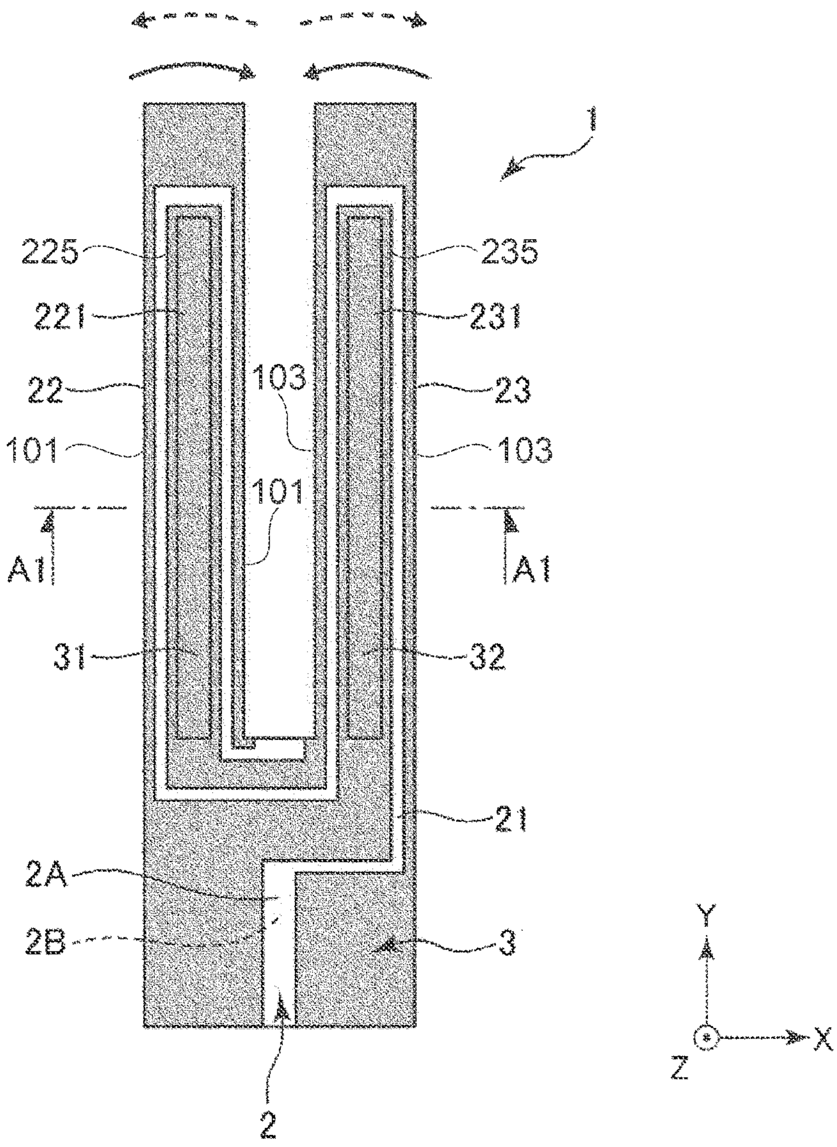
FIG. 1 is a plan view showing a vibrator element according to a first embodiment.
Figure 2:
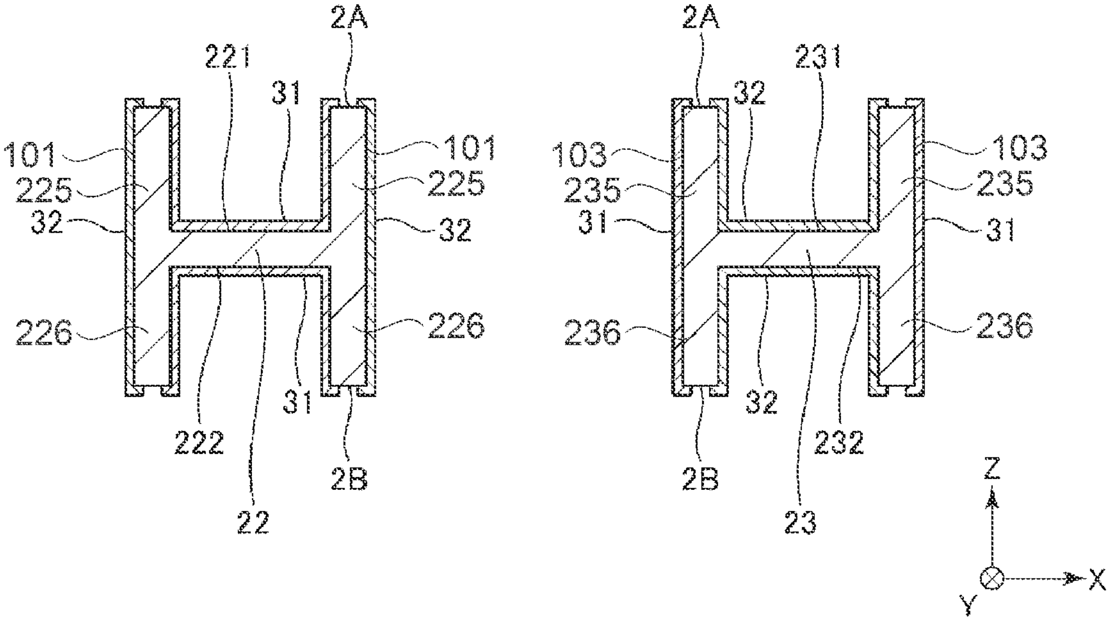
FIG. 2 is a cross sectional view taken along a line A1-A1 in FIG. 1.

As shown in FIGS. 1 and 2, the vibrator element 1 is a tuning fork type vibrator element, and includes a vibration substrate 2 and an electrode 3 formed on a surface of the vibration substrate 2.

The vibration substrate 2 is formed by patterning a Z-cut quartz crystal substrate serving as a Z-cut quartz crystal substrate into a desired shape. The vibration substrate 2 has a width in an X-Y plane defined by the X axis and the Y axis which are crystallographic axes of the quartz crystal, and has a thickness along the Z direction. The X axis is also referred to as an electrical axis, the Y axis is also referred to as a mechanical axis, and the Z axis is also referred to as an optical axis.

The vibration substrate 2 has a plate shape and has a first surface 2A and a second surface 2B that are in a front and back relationship relative to each other and are arranged along the Z direction. The vibration substrate 2 includes a base portion 21, and a first vibration arm 22 and a second vibration arm 23 that extend from the base portion 21 along the Y direction and are arranged side by side along the X direction.

The first vibration arm 22 includes a bottomed first groove 221 that opens to the first surface 2A, a first bank portion 225 that defines the first groove 221, a bottomed second groove 222 that opens to the second surface 2B, a second bank portion 226 that defines the second groove 222, and a side surface 101 that couples the first surface 2A and the second surface 2B. The first bank portion 225 is a portion that sandwiches the first groove 221 along the X direction on the first surface 2A in a plan view. The second bank portion 226 is a portion that sandwiches the second groove 222 along the X direction on the second surface 2B in a plan view.

The second vibration arm 23 includes a bottomed first groove 231 that opens to the first surface 2A, a first bank portion 235 that defines the first groove 231, a bottomed second groove 232 that opens to the second surface 2B, a second bank portion 236 that defines the second groove 232, and a side surface 103 that couples the first surface 2A and the second surface 2B. The first bank portion 235 is a portion that sandwiches the first groove 231 along the X direction on the first surface 2A in a plan view. The second bank portion 236 is a portion that sandwiches the second groove 232 along the X direction on the second surface 2B in a plan view.

The first grooves 221 and 231 and the second grooves 222 and 232 extend along the Y direction. The first bank portions 225 and 235 are respectively formed on both sides of the first grooves 221 and 231 in the X direction, and extend along the Y direction. The second bank portions 226 and 236 are respectively formed on both sides of the second grooves 222 and 232 in the X direction, and extend along the Y direction. Therefore, the first vibration arm 22 and the second vibration arm 23 have a substantially H-shaped cross sectional shape. As a result, a thermoelastic loss is reduced, and the vibrator element 1 has an excellent vibration property.

The electrode 3 includes signal electrodes 31 and ground electrodes 32. The signal electrodes 31 are disposed on the first surface 2A and the second surface 2B of the first vibration arm 22 and the side surface 103 of the second vibration arm 23. On the other hand, the ground electrodes 32 are disposed on the side surface 101 of the first vibration arm 22 and the first surface 2A and the second surface 2B of the second vibration arm 23. When a drive signal is applied to the signal electrodes 31 in a state in which the ground electrodes 32 are grounded, the first vibration arm 22 and the second vibration arm 23 perform a flexural vibration in the X direction so as to repeatedly come close to and separate from each other, as shown by arrows in FIG. 1.

The vibrator element 1 is briefly described above.

Next, a method for manufacturing the vibrator element 1 will be described.

Figure 3:
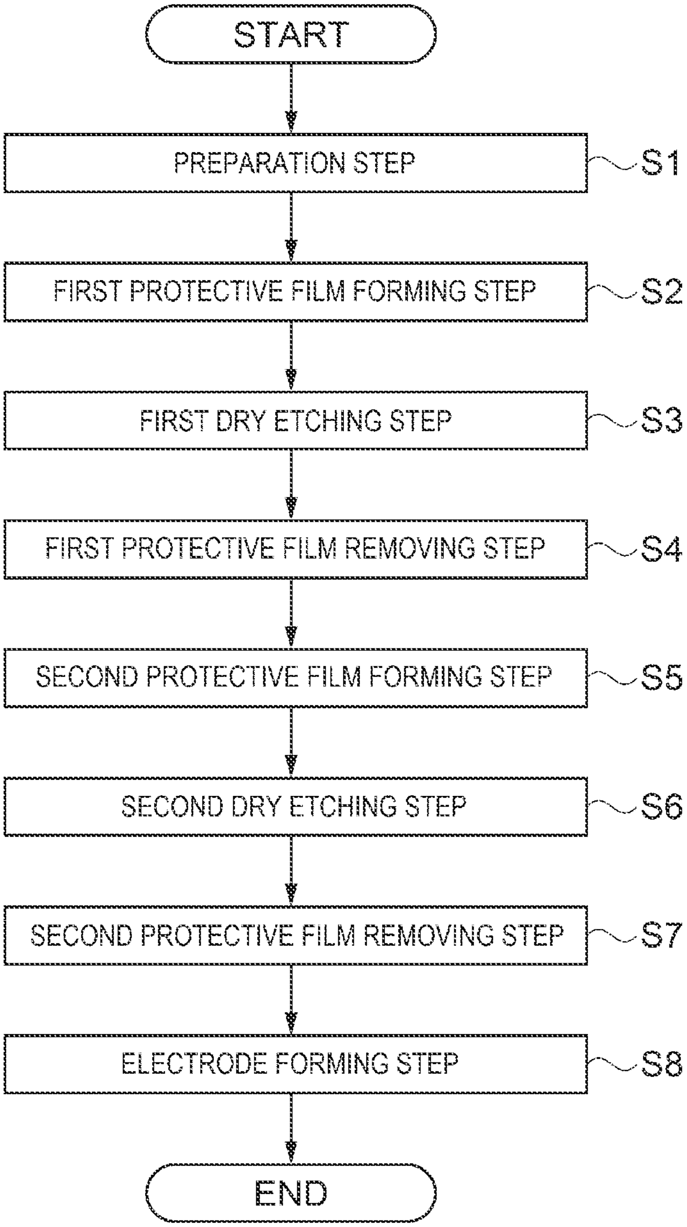
FIG. 3 is a diagram showing steps of manufacturing the vibrator element according to the first embodiment.

As shown in FIG. 3, the method for manufacturing the vibrator element 1 includes: a preparation step S1 of preparing a quartz crystal substrate 20 which is a base material of the vibration substrate 2, a first protective film forming step S2 of forming a first protective film 5 on a first substrate surface 20A of the quartz crystal substrate 20, a first dry etching step S3 of dry etching the quartz crystal substrate 20 from a first substrate surface 20A side via the first protective film 5, a first protective film removing step S4 of removing the first protective film 5 remaining on the first substrate surface 20A of the quartz crystal substrate 20, a second protective film forming step S5 of forming a second protective film 6 on a second substrate surface 20B of the quartz crystal substrate 20, a second dry etching step S6 of dry etching the quartz crystal substrate 20 from a second substrate surface 20B side via the second protective film 6, a second protective film removing step S7 of removing the second protective film 6 remaining on the second substrate surface 20B of the quartz crystal substrate 20, and an electrode forming step S8 of forming the electrode 3 on a surface of the vibration substrate 2 obtained by the above steps.

In the present embodiment, outer shapes of the first vibration arm 22 and the second vibration arm 23 are formed to be closer to the second substrate surface 20B in the Z direction than are positions where bottom surfaces of the second grooves 222 and 232 are formed in the first dry etching step S3.

Hereinafter, each step will be described in order.

Preparation Step S1

Figure 4:
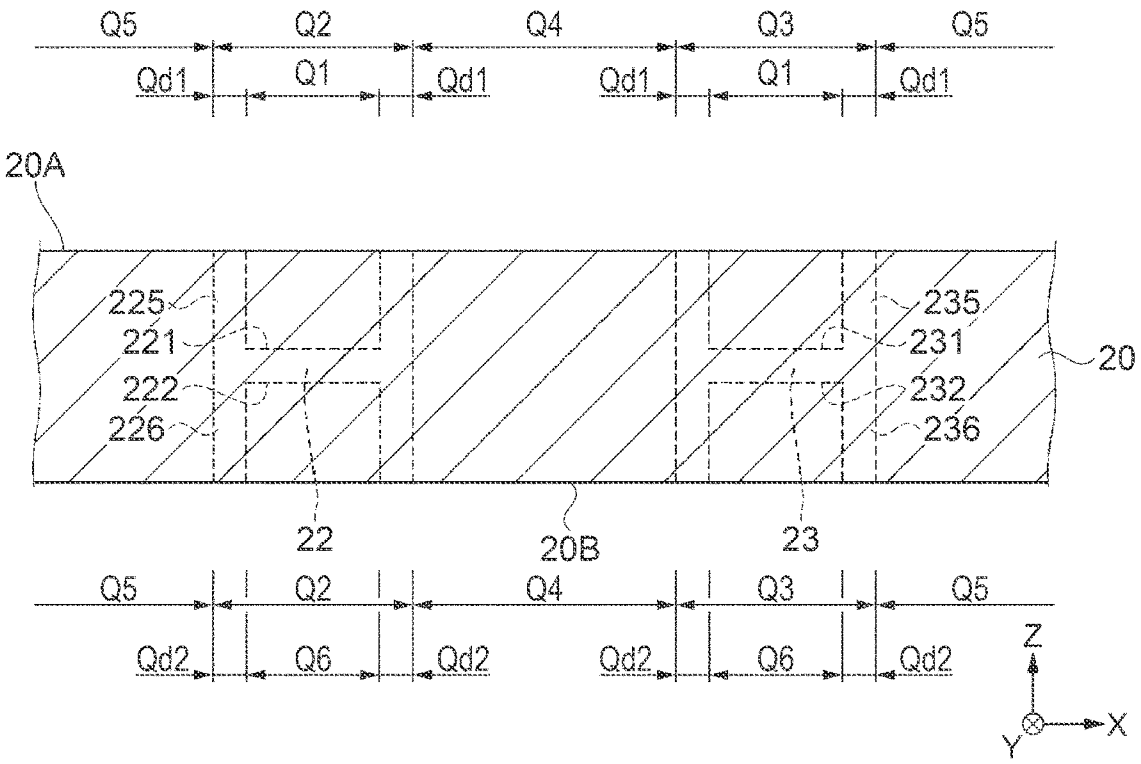
FIG. 4 is a cross sectional view showing a method for manufacturing the vibrator element.

As shown in FIG. 4, the quartz crystal substrate 20 which is the base material of the vibration substrate 2 is prepared. A plurality of vibrator elements 1 are collectively formed from the quartz crystal substrate 20. The quartz crystal substrate 20 is formed in a plate shape, and has the first substrate surface 20A and the second substrate surface 20B that are in a front and back relationship relative to each other and are arranged along the Z direction. In the present embodiment, the first substrate surface 20A is an upper surface of the quartz crystal substrate 20, and the second substrate surface 20B is a lower surface of the quartz crystal substrate 20.

The quartz crystal substrate 20 is adjusted to have a desired thickness by a polishing treatment such as lapping or polishing, and the first substrate surface 20A and the second substrate surface 20B are sufficiently smoothed. The quartz crystal substrate 20 may be subjected to a surface treatment by wet etching as needed.

Hereinafter, a region in which the first vibration arm 22 is formed is referred to as a first vibration arm forming region Q2. A region in which the second vibration arm 23 is formed is referred to as a second vibration arm forming region Q3. A region located between the first vibration arm forming region Q2 and the second vibration arm forming region Q3 is referred to as an inter-arm region Q4. In addition, a region located between adjacent vibration substrates 2 is referred to as an inter-element region Q5.

The first vibration arm forming region Q2 and the second vibration arm forming region Q3 include respective first groove forming regions Q1 in which the respective first grooves 221 and 231 are formed, and respective first bank portion forming regions Qd1 in which the respective first bank portions 225 and 235 are formed. In other words, the first bank portion forming regions Qd1 correspond to regions of the first vibration arm forming region Q2 and the second vibration arm forming region Q3 excluding the first groove forming regions Q1.

The first vibration arm forming region Q2 and the second vibration arm forming region Q3 include respective second groove forming regions Q6 in which the respective second grooves 222 and 232 are formed and second bank portion forming regions Qd2 in which the respective second bank portions 226 and 236 are formed. In other words, the second bank portion forming regions Qd2 correspond to regions of the first vibration arm forming region Q2 and the second vibration arm forming region Q3 excluding the second groove forming regions Q6.

First Protective Film Forming Step S2

Figure 5:
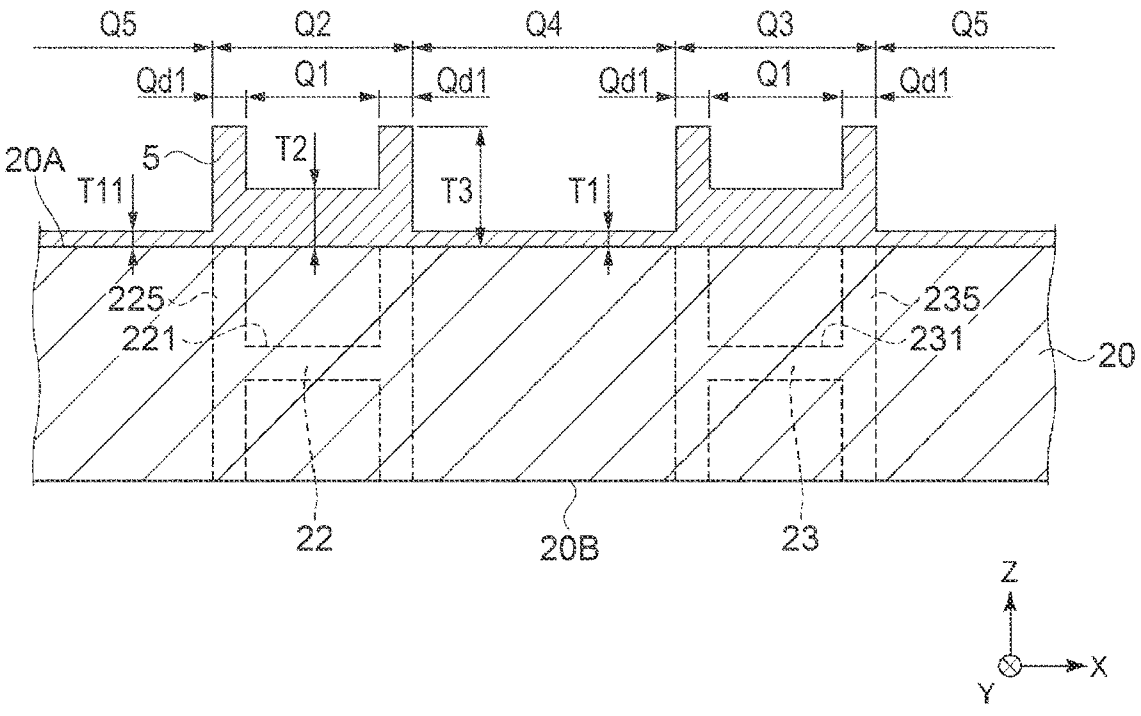
FIG. 5 is a cross sectional view showing the method for manufacturing the vibrator element.

As shown in FIG. 5, the first protective film 5 is formed on the first substrate surface 20A of the quartz crystal substrate 20.

The first protective film 5 includes a region in which the first protective film 5 has a small thickness along the Z direction and a region in which the first protective film 5 has a large thickness along the Z direction. The first protective film 5 is made of a material that is etched at a predetermined etching rate in the first dry etching step S3 to be described later.

The quartz crystal substrate 20 is etched from the first substrate surface 20A side of the quartz crystal substrate 20 via the first protective film 5 in the first dry etching step S3 to be described later. That is, etching of the first substrate surface 20A of the quartz crystal substrate 20 is started after the first protective film 5 is removed. Therefore, etching of the quartz crystal substrate 20 in the region in which the thickness of the first protective film 5 is small is started earlier than etching of the quartz crystal substrate 20 in the region in which the thickness of the first protective film 5 is large, so that an etching depth is large. On the other hand, etching of the quartz crystal substrate 20 in the region in which the thickness of the first protective film 5 is large is started later than etching of the quartz crystal substrate 20 in the region in which the thickness of the first protective film 5 is small, so that an etching depth of the quartz crystal substrate 20 is small. In this manner, the etching depth of the quartz crystal substrate 20 can be controlled by adjusting the thickness of the first protective film 5.

The first protective film 5 is formed in the first vibration arm forming region Q2, the second vibration arm forming region Q3, the inter-arm region Q4, and the inter-element region Q5 of the first substrate surface 20A.

Thicknesses of the first protective film 5 along the Z direction satisfy $T1<T2<T3$ in which a thickness of the first protective film 5 along the Z direction in the inter-arm region Q4 is defined as T1, a thickness of the first protective film 5 along the Z direction in the first groove forming region Q1 is defined as T2, and a thickness of the first protective film 5 along the Z direction in the first bank portion forming region Qd1 is defined as T3.

Since the first protective film 5 is formed such that the thicknesses of the first protective film 5 satisfy $T1<T2<T3$, the etching depth of the quartz crystal substrate 20 in the inter-arm region Q4 is larger than the etching depth of the quartz crystal substrate 20 in the first groove forming region Q1 in the first dry etching step S3 to be described later. The etching depth of the quartz crystal substrate 20 in the first groove forming region Q1 is larger than the etching depth of the quartz crystal substrate 20 in the first bank portion forming region Qd1.

In addition, the thicknesses of the first protective film 5 along the Z direction satisfy T11<T2<T3 in which a thickness of the first protective film 5 along the Z direction in the inter-element region Q5 is defined as T11.

Since the first protective film 5 is formed such that the thicknesses of the first protective film 5 satisfy T11<T2<T3, the etching depth of the quartz crystal substrate 20 in the inter-element region Q5 is larger than the etching depth of the quartz crystal substrate 20 in the first groove forming region Q1 in the first dry etching step S3 to be described later.

In the present embodiment, the first protective film 5 in the inter-element region Q5 is formed in a similar manner to the first protective film 5 in the inter-arm region Q4. Therefore, the thickness T11 of the first protective film 5 in the inter-element region Q5 is substantially equal to the thickness T1 of the first protective film 5 in the inter-arm region Q4.

The expression "substantially equal to" is a concept including a case where values are not strictly equal to each other due to variations in manufacturing conditions and the like.

A method for forming the first protective film 5 will be described.

Figure 6:
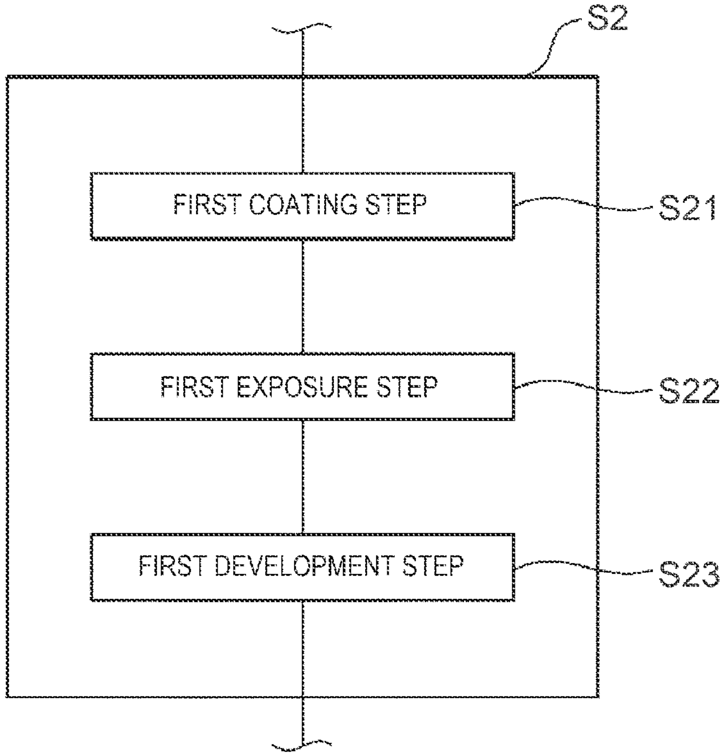
FIG. 6 is a diagram showing a first protective film forming step.

As shown in FIG. 6, the first protective film forming step S2 includes a first coating step S21 of coating a resist material to the first substrate surface 20A of the quartz crystal substrate 20 to form a resist film, a first exposure step S22 of exposing the resist film formed on the first substrate surface 20A, and a first development step S23 of developing the resist film formed on the first substrate surface 20A in the present embodiment.

Figure 7:
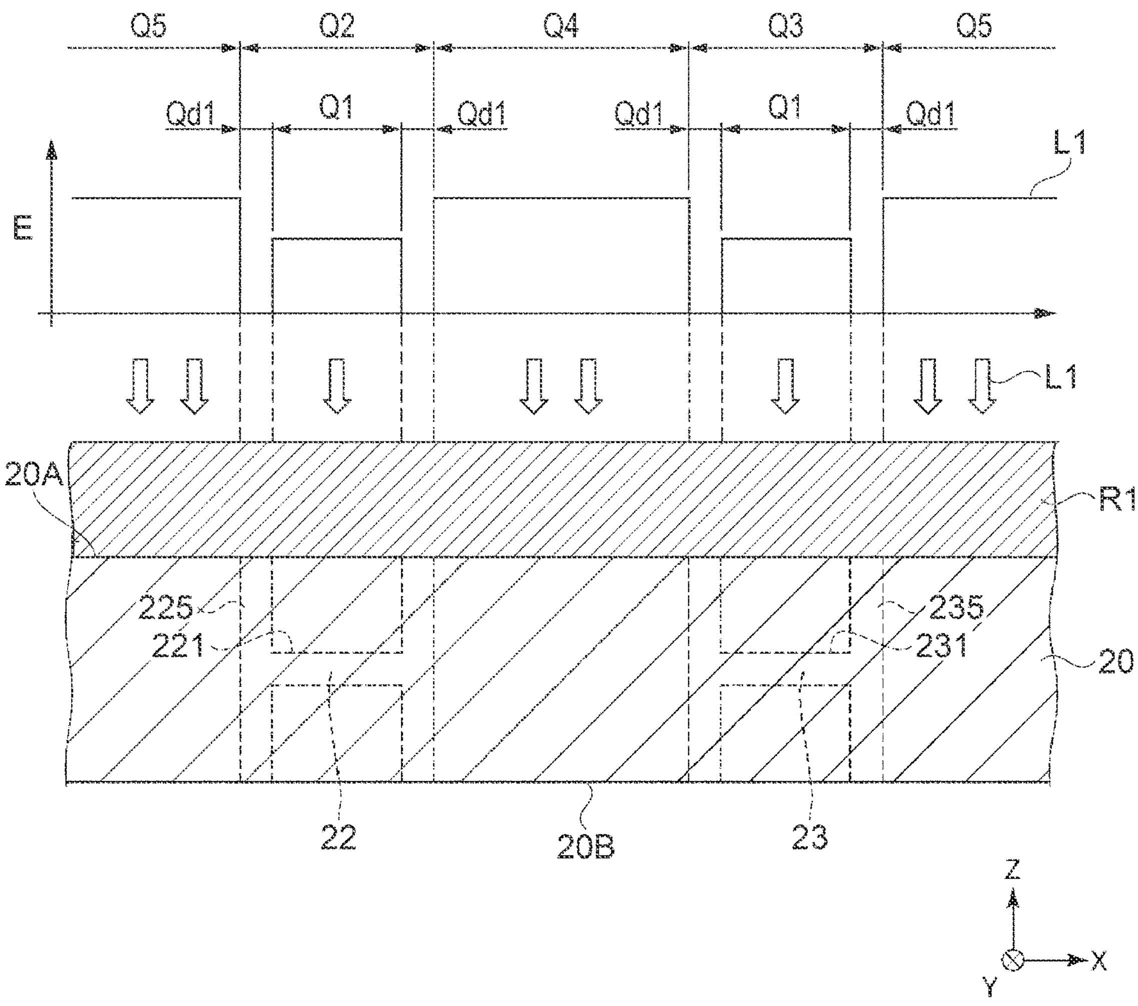
FIG. 7 is a cross sectional view showing a method for forming a first protective film.

As shown in FIG. 7, a first resist film R1 is formed on the first substrate surface 20A of the quartz crystal substrate 20 in the first coating step S21. The first resist film R1 is a resist film made of a resist material. The first resist film R1 is formed by coating a resist material on the first substrate surface 20A at a predetermined thickness. Examples of a method for coating the resist material can include, a spin coating method, a spray coating method, or the like.

In the present embodiment, the resist material is a positive photoresist. The resist material may be a negative resist material.

Next, the first resist film R1 formed on the first substrate surface 20A is irradiated with electromagnetic waves L1 in the first exposure step S22. The first resist film R1 is irradiated with the electromagnetic waves L1 at an exposure intensity E corresponding to each of the inter-arm region Q4, the first groove forming region Q1, the first bank portion forming region Qd1, and the inter-element region Q5. FIG. 7 shows an example of a distribution of the exposure intensity E of the electromagnetic waves L1 in the X direction. The exposure intensity E of the electromagnetic waves L1 can be changed using a filter, a gray scale mask, or the like.

Next, the first resist film R1 formed on the first substrate surface 20A is developed in the first development step S23. The thickness of the first protective film 5 corresponds to the exposure intensity E of the electromagnetic waves L1 emitted to the first resist film R1 in the first exposure step S22.

In this manner, the first protective film 5 shown in FIG. 5 is formed.

In the present embodiment, the first protective film 5 is formed of the first resist film R1. Therefore, the first protective film 5 can be easily formed.

The method for forming the first protective film 5 is not limited to the method described above. For example, the first protective film 5 may be formed using a printing technique such as an imprint method.

The first protective film 5 is not limited to a resist film made of a resist material. For example, the first protective film 5 may be a metal film made of a metal such as nickel, copper, or chromium. Such a metal film can be formed by, for example, a plating method. In general, an etching rate of a metal is lower than an etching rate of a photoresist used for a resist material. Therefore, in a case where the first protective film 5 is formed of a metal film, the thickness of the first protective film 5 can be made smaller than the thickness of the first protective film 5 formed of a resist film. Accordingly, dimensional accuracy of the first and second vibration arms 22 and 23, the first grooves 221 and 231, and the like formed in the first dry etching step S3 can be improved.

First Dry Etching Step S3

Figure 8:
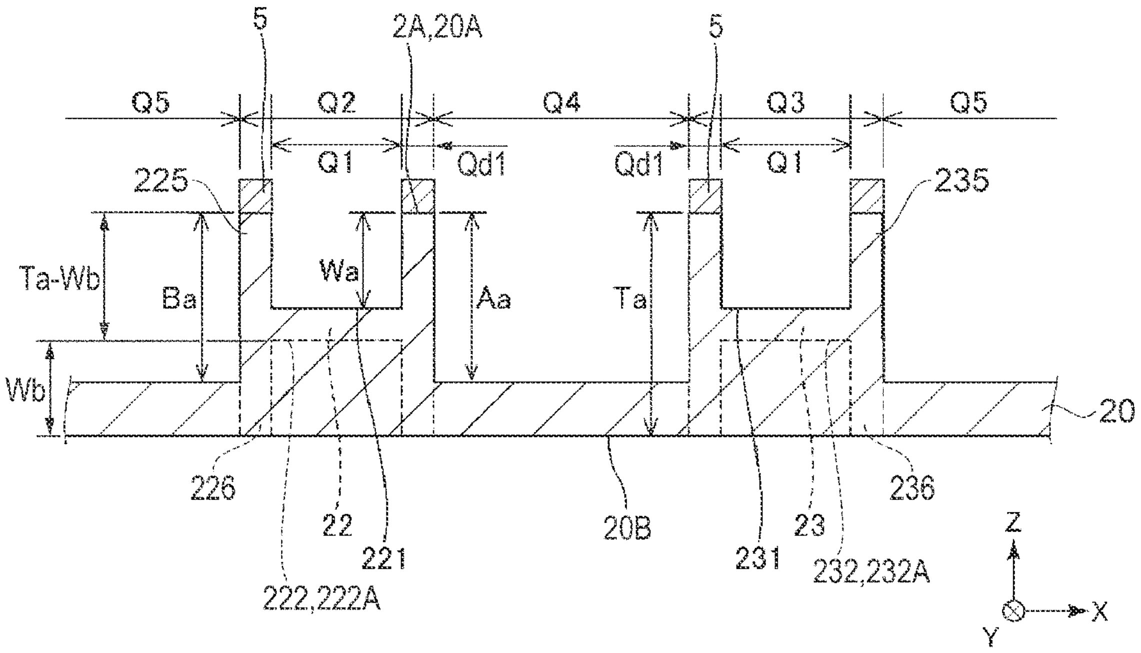
FIG. 8 is a cross sectional view showing the method for manufacturing the vibrator element.

As shown in FIG. 8, the quartz crystal substrate 20 is dry etched from the first substrate surface 20A side via the first protective film 5, and the first surface 2A, the first grooves 221 and 231, and an outer shape of the vibration substrate 2 are simultaneously formed. The expression "simultaneously formed" refers to that the first surface 2A, the first grooves 221 and 231, and the outer shape of the vibration substrate 2 are collectively formed in one step. That is, the first surface 2A, the first grooves 221 and 231, and the outer shape of the vibration substrate 2 are collectively formed in the first dry etching step S3.

More specifically, the dry etching in this step is reactive ion etching, and is performed using a reactive ion etching device (an RIE device). A reactive gas introduced into the RIE device is not particularly limited, and for example, $SF_6$, $CF_4$, $C_2F$, $C_2F_6$, $C_3F_6$, and $C_4F_8$ can be used.

The first protective film 5 formed on the first substrate surface 20A of the quartz crystal substrate 20 is etched at a predetermined etching rate in the first dry etching step S3. Then, the first protective film 5 is removed to expose the first substrate surface 20A, and etching of the quartz crystal substrate 20 is started. Therefore, the etching depth of the quartz crystal substrate 20 can be controlled by adjusting the thickness of the first protective film 5. In addition, when the thickness of the first protective film 5 is sufficiently increased, the first dry etching step S3 can be ended in a state in which the first protective film 5 remains on the first substrate surface 20A, and the first substrate surface 20A can be prevented from being etched.

The first dry etching step S3 is ended when the first grooves 221 and 231 have a desired depth. The etching depth of the quartz crystal substrate 20 in the first groove forming region Q1 is a depth Wa of the first grooves 221 and 231. The etching depth of the quartz crystal substrate 20 in the inter-arm region Q4 is a depth Aa of the outer shape of the vibration substrate 2. The etching depth of the quartz crystal substrate 20 in the inter-element regions Q5 is a depth Ba of the outer shape of the vibration substrate 2.

As described above, the thickness T1 of the first protective film 5 in the inter-arm region Q4 and the thickness T11 of the first protective film 5 in the inter-element region Q5 are smaller than the thickness T2 of the first protective film 5 in the first groove forming region Q1. That is, T1<T2 and T11<T2. Therefore, the depths Aa and Ba of the outer shape of the vibration substrate 2 are larger than the depth Wa of the first grooves 221 and 231. That is, Wa<Aa and Wa<Ba.

As described above, the thickness T2 of the first protective film 5 in the first groove forming region Q1 is smaller than the thickness T3 of the first protective film 5 in the first bank portion forming region Qd1. That is, $T2<T3$. Therefore, the depth Wa of the first grooves 221 and 231 is larger than the etching depth of the quartz crystal substrate 20 in the first bank portion forming region Qd1.

As described above, in the first dry etching step S3, the quartz crystal substrate 20 is dry etched from the first substrate surface 20A side via the first protective film 5, so that the outer shapes of the first and second vibration arms 22 and 23 and the first grooves 221 and 231 can be collectively formed.

Since the dry etching can be performed without being affected by a crystal plane of the quartz crystal, the first grooves 221 and 231 and the outer shape of the vibration substrate 2 can be formed with excellent dimensional accuracy.

It is possible to reduce manufacturing steps of the vibrator element 1 and reduce the cost of the vibrator element 1 by collectively forming the first grooves 221 and 231 and the outer shape of the vibration substrate 2. In addition, since a positional deviation of the first grooves 221 and 231 relative to the outer shape is prevented, it is possible to improve formation accuracy of the vibration substrate 2.

Since the first protective film 5 is formed such that the thicknesses of the first protective film 5 satisfy $T1<T2<T3$ and $T11<T2<T3$, the outer shapes of the first and second vibration arms 22 and 23 and the first grooves 221 and 231 can be collectively formed without using a micro loading effect in the first dry etching step S3.

Since the micro loading effect is not used, there is no restriction on the setting of dimensions such as a width of the inter-arm region Q4, a width of the inter-element region Q5, and widths of the first grooves 221 and 231, and it is possible to improve the degree of freedom in designing the vibrator element 1. For example, in the first protective film forming step S2, dimensions of the first grooves 221 and 231 and the outer shapes of the first and second vibration arms 22 and 23 can be controlled by adjusting the thickness and the width of the first protective film 5.

In addition, since the micro loading effect is not used, there is less restriction on a dry etching condition such as the selection of a reactive gas used in the dry etching, and thus the vibrator element 1 can be easily manufactured as compared with a case where the micro loading effect is used.

In the present embodiment, the depths Aa and Ba of the outer shape of the vibration substrate 2 is larger than $Ta-Wb$ that is a difference between a thickness Ta of the quartz crystal substrate 20 and a depth Wb of the second grooves 222 and 232 formed in the second dry etching step S6 to be described later. That is, $Ta-Wb<Aa$ and $Ta-Wb<Ba$.

$Ta-Wb$ that is the difference between the thickness Ta of the quartz crystal substrate 20 and the depth Wb of the second grooves 222 and 232 corresponds to a distance in the Z direction from the first substrate surface 20A of the quartz crystal substrate 20 to bottom surfaces 222A and 232A of the second grooves 222 and 232.

That is, $Ta-Wb<Aa$ and $Ta-Wb<Ba$ indicate that the depths Aa and Ba of the outer shape of the vibration substrate 2 are larger than depths at positions of the bottom surfaces 222A and 232A of the respective second grooves 222 and 232.

In other words, in the first dry etching step S3, the outer shapes of the first vibration arm 22 and the second vibration arm 23 are formed to be closer to the second substrate surface 20B in the Z direction than are the positions where the bottom surfaces 222A and 232A of the respective second grooves 222 and 232 are formed.

As described above, in the first dry etching step S3, the outer shapes of the first vibration arm 22 and the second vibration arm 23 are formed to be closer to the second substrate surface 20B in the Z direction than are the positions where the bottom surfaces 222A and 232A of the second grooves 222 and 232 are formed, so that the second grooves 222 and 232 can be formed in the second dry etching step S6 to be described later without forming the second protective film 6 in the second groove forming region Q6 of the second substrate surface 20B in the second protective film forming step S5 to be described later.

In the present embodiment, the thickness T1 of the first protective film 5 in the inter-arm region Q4 and the thickness T11 of the first protective film 5 in the inter-element region Q5 satisfy $0<T1$ and $0<T11$.

Since $0<T1$ and $0<T11$, even when the thickness of the first resist film R1 varies, the difference between the depths Aa and Ba of the outer shape of the vibration substrate 2 and the depth Wa of the first grooves 221 and 231 can be made substantially constant.

The thicknesses T1 and T11 of the first protective film 5 in the inter-arm region Q4 and the inter-element region Q5 and the thickness T2 of the first protective film 5 in the first groove forming region Q1 vary depending on a variation in the thickness of the first resist film R1. However, since $0<T1$ and $0<T11$, the difference between the thicknesses T1 and T11 of the first protective film 5 in the inter-arm region Q4 and the inter-element region Q5 and the thickness T2 of the first protective film 5 in the first groove forming region Q1 is kept substantially constant. That is, a time difference between a time when the etching of the quartz crystal substrate 20 is started in the inter-arm region Q4 and the inter-element region Q5 and a time when the etching of the quartz crystal substrate 20 is started in the first groove forming region Q1 is substantially constant. Therefore, the differences between the depths Aa and Ba of the outer shape of the vibration substrate 2 and the depth Wa of the first grooves 221 and 231 can be made substantially constant.

In the present embodiment, the dry etching is ended in a state in which the first protective film 5 remains in the first bank portion forming region Qd1 of the first substrate surface 20A in the first dry etching step S3 by sufficiently increasing the thickness T3 of the first protective film 5 in the first bank portion forming region Qd1. That is, the first bank portion forming region Qd1 of the first substrate surface 20A is protected by the first protective film 5, and is not etched in the first dry etching step S3. The first bank portion forming regions Qd1 of the first substrate surface 20A become the first surfaces 2A of the first and second vibration arms 22 and 23 in the first protective film removing step S4 to be described later.

The dry etching may be ended in a state in which the first protective film 5 does not remain in the first bank portion forming region Qd1 of the first substrate surface 20A in the first dry etching step S3 by adjusting the thickness T3 of the first protective film 5 in the first bank portion forming region Qd1. That is, the first bank portion forming region Qd1 of the first substrate surface 20A may be etched in the first dry etching step S3. In this case, the surfaces etched in the first dry etching step S3 become the first surfaces 2A of the first and second vibration arms 22 and 23.

As described above, the first surface 2A can be formed by etching the first bank portion forming regions Qd1 of the first substrate surface 20A or by not etching the first bank portion forming regions Qd1 of the first substrate surface 20A in the first dry etching step S3.

First Protective Film Removing Step S4

Figure 9:
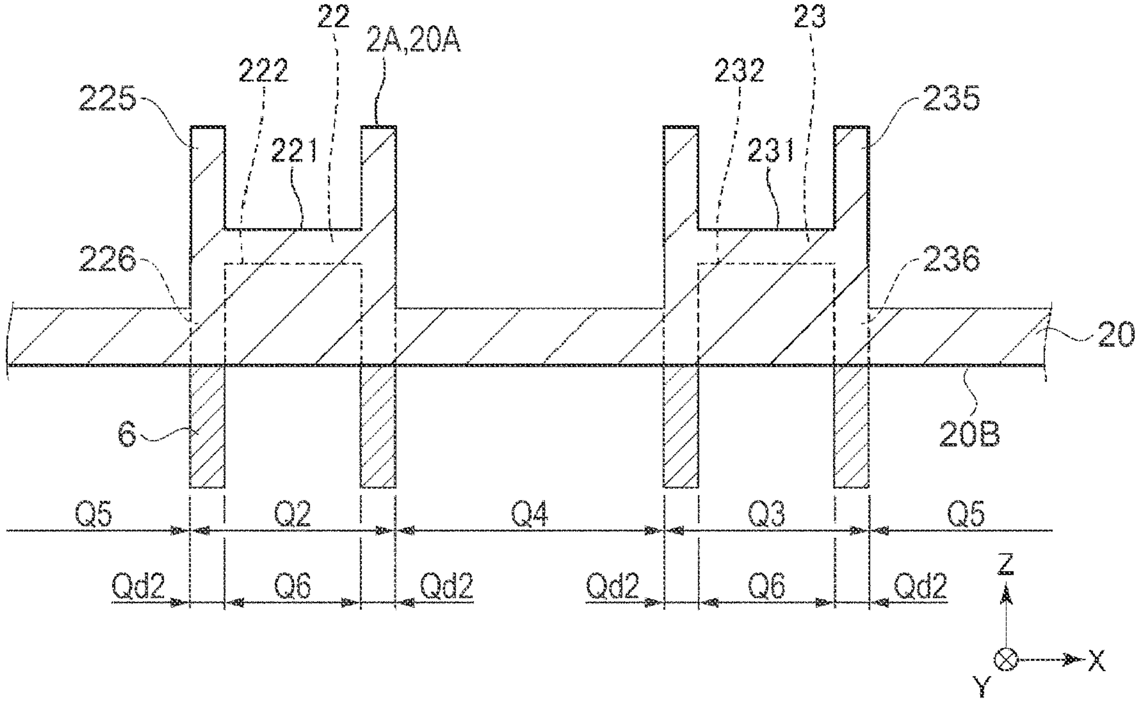
FIG. 9 is a cross sectional view showing the method for manufacturing the vibrator element.

As shown in FIG. 9, the first protective film 5 remaining in the first bank portion forming region Qd1 of the first substrate surface 20A is removed. As a result, the first substrate surface 20A of the quartz crystal substrate 20 becomes the first surfaces 2A of the first and second vibration arms 22 and 23. That is, since the first surface 2A on the first and second vibration arms 22 and 23 is not etched in the first dry etching step S3, the thickness of the first and second vibration arms 22 and 23 and a surface roughness of the first surface 2A in the first bank portion forming region Qd1 are maintained as the thickness of the quartz crystal substrate 20 and a surface roughness of the first substrate surface 20A. Therefore, thickness accuracy of the first and second vibration arms 22 and 23 is improved, and an unnecessary vibration such as a torsional vibration is prevented from occurring.

In the first dry etching step S3 described above, when the dry etching is ended in a state in which the first protective film 5 does not remain on the first substrate surface 20A of the quartz crystal substrate 20, the first protective film removing step S4 may not be provided.

After the completion of the first protective film removing step S4, the method proceeds to a processing of the second substrate surface 20B of the quartz crystal substrate 20.

Second Protective Film Forming Step S5

As shown in FIG. 9, the second protective film 6 is formed on the second substrate surface 20B of the quartz crystal substrate 20.

The second protective film 6 is formed in the second bank portion forming region Qd2 of the second substrate surface 20B. That is, the second protective film 6 is not formed in the inter-arm region Q4, the inter-element region Q5, and the second groove forming region Q6 of the second substrate surface 20B.

Since the second protective film 6 is not formed in the inter-arm region Q4, the inter-element region Q5, and the second groove forming region Q6 of the second substrate surface 20B, etching depths in the inter-arm region Q4, the inter-element region Q5, and the second groove forming region Q6 are substantially equal to one another by performing dry etching in the second dry etching step S6 to be described later.

A method for forming the second protective film 6 will be described.

Figure 10:
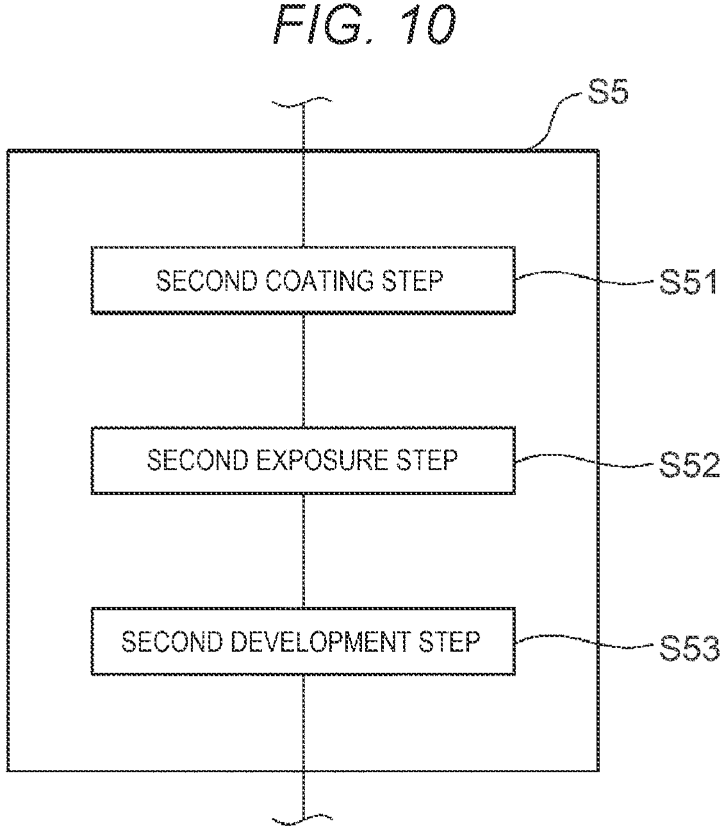
FIG. 10 is a diagram showing a second protective film forming step.

As shown in FIG. 10, the second protective film forming step S5 includes a second coating step S51 of coating a resist material to the second substrate surface 20B of the quartz crystal substrate 20 to form a resist film, a second exposure step S52 of exposing the resist film formed on the second substrate surface 20B, and a second development step S53 of developing the resist film formed on the second substrate surface 20B in the present embodiment.

Figure 11:
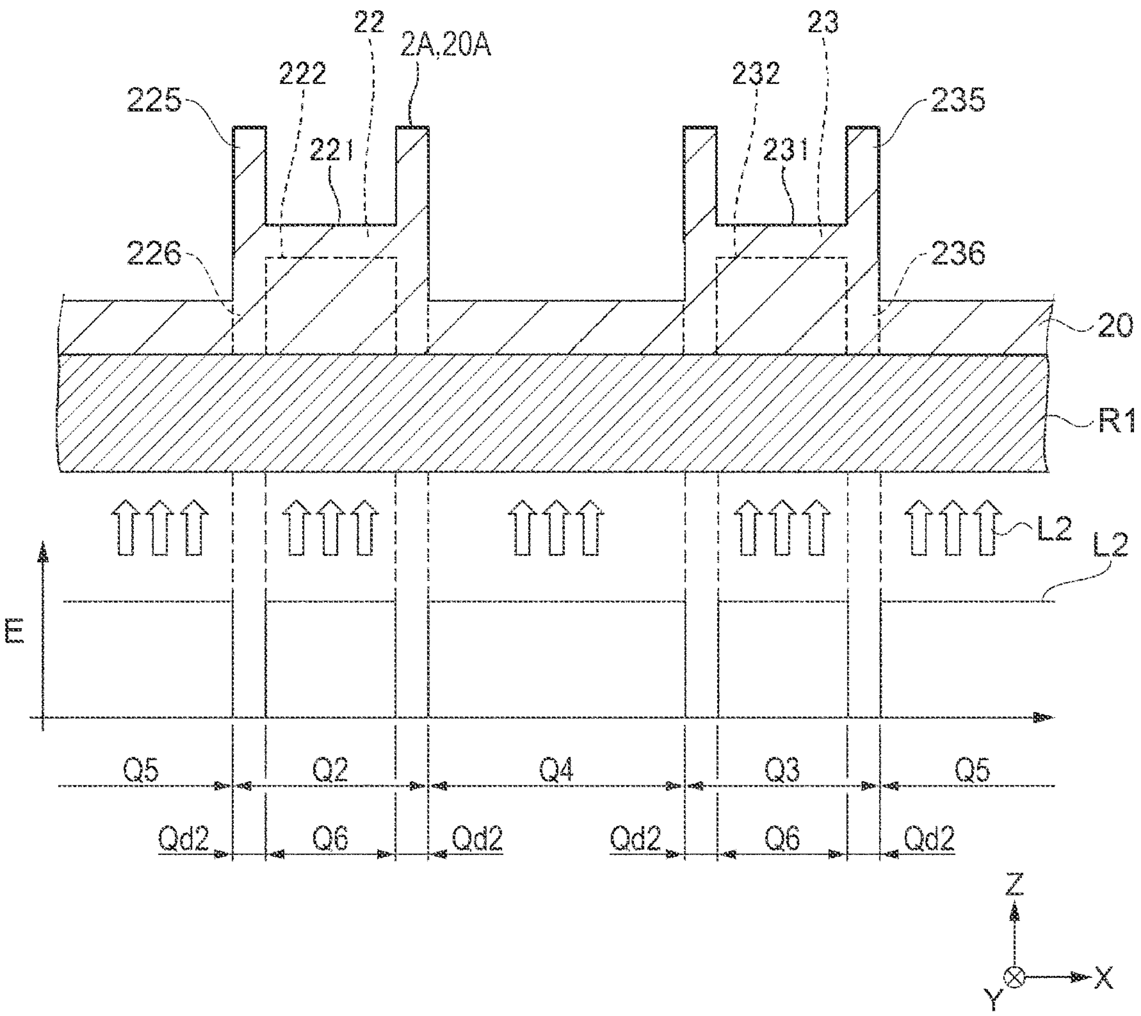
FIG. 11 is a cross sectional view showing a method for forming a second protective film.

As shown in FIG. 11, the first resist film R1 is formed on the second substrate surface 20B of the quartz crystal substrate 20 in the second coating step S51. The second coating step S51 is performed in a similar manner to the first coating step S21.

Next, the first resist film R1 formed on the second substrate surface 20B is irradiated with electromagnetic waves L2 in the second exposure step S52. The electromagnetic waves L2 are emitted such that the first resist film R1 remains in the second bank portion forming region Qd2 and the first resist film R1 is removed in regions other than the second bank portion forming region Qd2 in the second development step S53 to be described later.

Next, the first resist film R1 formed on the second substrate surface 20B is developed in the second development step S53. The second development step S53 is performed in a similar manner to the first development step S23.

In this manner, the second protective film 6 shown in FIG. 9 is formed.

In the present embodiment, the second protective film 6 is formed of the first resist film R1. Therefore, the second protective film 6 can be easily formed.

The method for forming the second protective film 6 is not limited to the method described above. For example, the second protective film 6 may be formed using a printing technique such as an imprint method.

The second protective film 6 is not limited to a resist film made of a resist material. For example, the second protective film 6 may be a metal film made of a metal.

Although the first protective film 5 and the second protective film 6 are resist films in the present embodiment, one of the first protective film 5 and the second protective film 6 may be a resist film and the other one may be a metal film. Both the first protective film 5 and the second protective film 6 may be metal films.

Second Dry Etching Step S6

Figure 12:
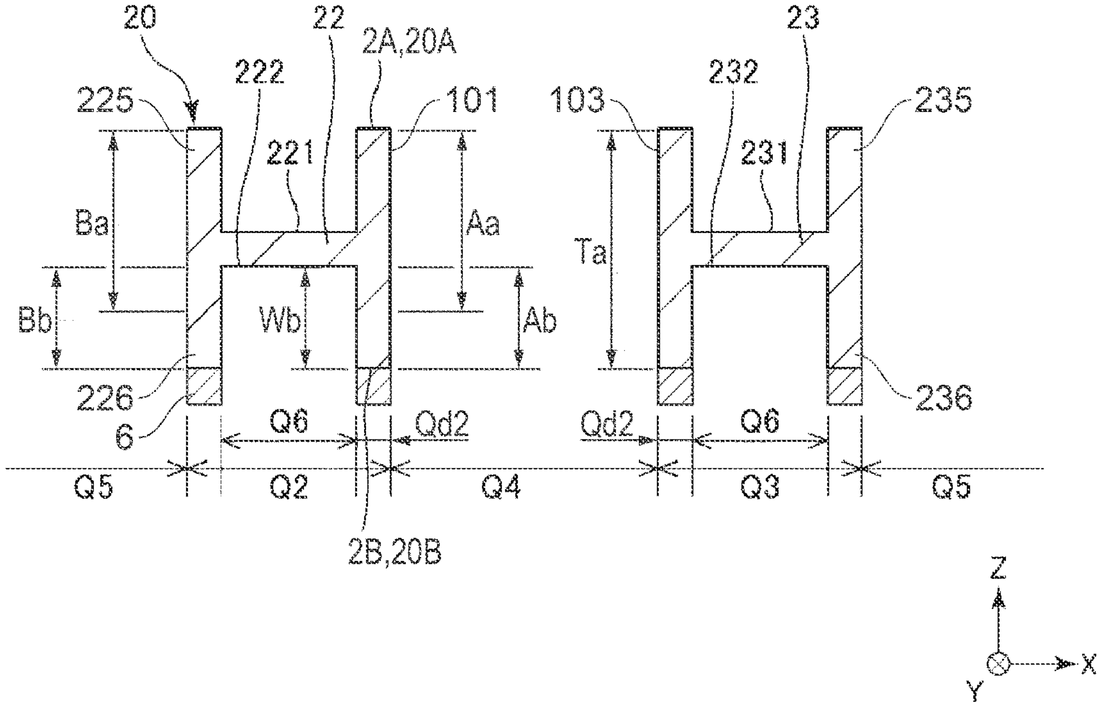
FIG. 12 is a cross sectional view showing the method for manufacturing the vibrator element.

As shown in FIG. 12, the quartz crystal substrate 20 is dry etched from the second substrate surface 20B side via the second protective film 6, and the second surface 2B, the second grooves 222 and 232, and the outer shape of the vibration substrate 2 are simultaneously formed. That is, the second surface 2B, the second grooves 222 and 232, and the outer shape of the vibration substrate 2 are collectively formed in the second dry etching step S6. The outer shape of the vibration substrate 2 is formed and the inter-arm region Q4 and the inter-element region Q5 are penetrated, thereby forming the first vibration arm 22 and the second vibration arm 23. The present step is performed in a similar manner to the first dry etching step S3.

The second dry etching step S6 is ended when the second grooves 222 and 232 have a desired depth. The etching depth of the quartz crystal substrate 20 in the second groove forming region Q6 is the depth Wb of the second grooves 222 and 232. The etching depth of the quartz crystal substrate 20 in the inter-arm region Q4 is a depth Ab of the outer shape of the vibration substrate 2. The etching depth of the quartz crystal substrate 20 in the inter-element region Q5 is a depth Bb of the outer shape of the vibration substrate 2.

As described above, in the second dry etching step S6, the quartz crystal substrate 20 is dry etched from the second substrate surface 20B side via the second protective film 6, so that outer shapes of the first and second vibration arms 22 and 23 and the second grooves 222 and 232 can be collectively formed without using the micro loading effect.

In the related art, when dry etching is performed from the second substrate surface 20B, etching depths in the inter-arm region Q4 and the inter-element region Q5 are set to be larger than an etching depth in the second groove forming region Q6 in order to penetrate the inter-arm region Q4 and the inter-element region Q5.

In order to make the etching depths in the inter-arm region Q4 and the inter-element region Q5 larger than the etching depth in the second groove forming region Q6 without using the micro loading effect, for example, it is considered to form the second protective film 6 in the second groove forming region Q6 of the second substrate surface 20B and the second groove forming region Q6 is protected from being etched.

On the other hand, as described above, the second protective film 6 is not formed in the second groove forming region Q6 of the second substrate surface 20B in the second protective film forming step S5 in the present embodiment. Specifically, the second protective film 6 is not formed in the inter-arm region Q4, the inter-element region Q5, and the second groove forming region Q6 of the second substrate surface 20B in the second protective film forming step S5. Therefore, the depth Wb of the second grooves 222 and 232 is substantially equal to the depths Ab and Bb of the outer shape of the vibration substrate 2 by performing dry etching in the second dry etching step S6.

Since the outer shapes of the first vibration arm 22 and the second vibration arm 23 are formed to be closer to the second substrate surface 20B in the Z direction than are the positions where the bottom surfaces 222A and 232A of the second grooves 222 and 232 are formed in the first dry etching step S3, the depths Aa and Ba of the outer shape of the vibration substrate 2 in the first dry etching step S3 and the depths Ab and Bb of the outer shape of the vibration substrate 2 in the second dry etching step S6 overlap with each other even when the depth Wb of the second grooves 222 and 232 and the depths Ab and Bb of the outer shape of the vibration substrate 2 are substantially equal to one another. As described above, even when the depth Wb of the second grooves 222 and 232 is substantially equal to the depths Ab and Bb of the outer shape of the vibration substrate 2, the inter-arm region Q4 and the inter-element region Q5 can be penetrated. That is, in the second dry etching step S6, even when the etching depths in the inter-arm region Q4 and the inter-element region Q5 is not set to be larger than the etching depth in the second groove forming region Q6 in the present embodiment, the inter-arm region Q4 and the inter-element region Q5 can be penetrated. In other words, even when the second protective film 6 is not formed in the second groove forming region Q6 of the second substrate surface 20B in the second protective film forming step S5, it is possible to penetrate the inter-arm region Q4 and the inter-element region Q5 while collectively forming the outer shapes of the first and second vibration arms 22 and 23 and the second grooves 222 and 232 in the second dry etching step S6.

As described above, the second protective film 6 is formed in the second bank portion forming region Qd2 of the second substrate surface 20B and is not formed in the second groove forming region Q6 in the present embodiment. That is, the second groove forming region Q6 of the second substrate surface 20B is exposed. Therefore, etching of the second groove forming region Q6 is started together with the start of the dry etching in the second dry etching step S6. As described above, since the second grooves 222 and 232 can be formed in the second dry etching step S6 without forming the second protective film 6 in the second groove forming region Q6 of the second substrate surface 20B in the second protective film forming step S5, the second grooves 222 and 232 can be formed in a short time.

As described above, the second protective film 6 is formed in the second bank portion forming region Qd2 of the second substrate surface 20B, and is not formed in the inter-arm region Q4 and the inter-element region Q5 in the present embodiment. That is, the inter-arm region Q4 and the inter-element region Q5 of the second substrate surface 20B are exposed. Therefore, the etching of the inter-arm region Q4 and the inter-element region Q5 is started together with the start of the dry etching in the second dry etching step S6. Therefore, the inter-arm region Q4 and the inter-element region Q5 can be penetrated in a short time in the second dry etching step S6.

In the present embodiment, the dry etching is ended in a state in which the second protective film 6 remains in the second bank portion forming region Qd2 of the second substrate surface 20B in the second dry etching step S6 by sufficiently increasing the thickness of the second protective film 6 in the second bank portion forming region Qd2. That is, the second bank portion forming region Qd2 of the second substrate surface 20B is not etched in the second dry etching step S6. The second bank portion forming region Qd2 of the second substrate surface 20B becomes the second surface 2B of the first and second vibration arms 22 and 23 in the second protective film removing step S7 to be described later.

The dry etching may be ended in a state in which the second protective film 6 does not remain in the second bank portion forming region Qd2 of the second substrate surface 20B in the second dry etching step S6 by adjusting the thickness of the second protective film 6 in the second bank portion forming region Qd2. That is, the second bank portion forming region Qd2 of the second substrate surface 20B may be etched in the second dry etching step S6. In this case, the surfaces etched in the second dry etching step S6 become the second surfaces 2B of the first and second vibration arms 22 and 23.

As described above, the second surface 2B can be formed by etching the second bank portion forming region Qd2 of the second substrate surface 20B or by not etching the second bank portion forming region Qd2 of the second substrate surface 20B in the second dry etching step S6.

Second Protective Film Removing Step S7

Figure 13:
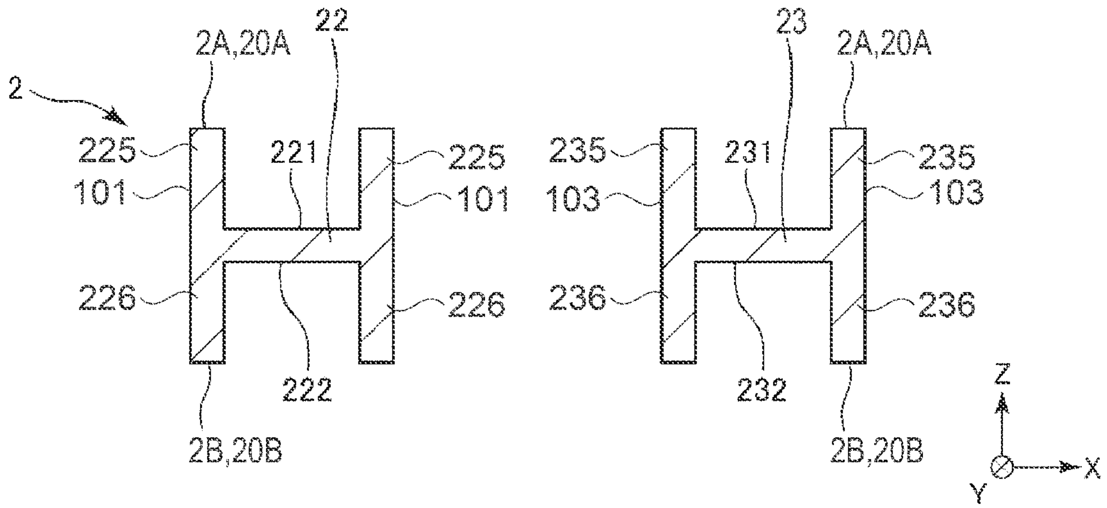
FIG. 13 is a cross sectional view showing the method for manufacturing the vibrator element.

As shown in FIG. 13, the second protective film 6 remaining in the second bank portion forming region Qd2 of the second substrate surface 20B is removed. As a result, the second substrate surface 20B of the quartz crystal substrate 20 becomes the second surfaces 2B of the first and second vibration arms 22 and 23. That is, since the second surfaces 2B of the first and second vibration arms 22 and 23 are not etched in the second dry etching step S6, the thickness of the first and second vibration arms 22 and 23 and a surface roughness of the second surface 2B in the second bank portion forming region Qd2 are maintained as the thickness of the quartz crystal substrate 20 and a surface roughness of the second substrate surface 20B. Therefore, thickness accuracy of the first and second vibration arms 22 and 23 is improved, and an unnecessary vibration such as a torsional vibration is prevented from occurring.

In the second dry etching step S6 described above, when the dry etching is ended in a state in which the second protective film 6 does not remain on the second substrate surface 20B of the quartz crystal substrate 20, the second protective film removing step S7 may not be provided.

Although the first protective film 5 remaining on the first substrate surface 20A is removed in the first protective film removing step S4 and the second protective film 6 remaining on the second substrate surface 20B is removed in the second protective film removing step S7 in the present embodiment, the first protective film removing step S4 may not be provided, and the first protective film 5 remaining on the first substrate surface 20A and the second protective film 6 remaining on the second substrate surface 20B may be collectively removed in the second protective film removing step S7.

As shown in FIG. 13, a plurality of vibration substrates 2 are collectively formed from the quartz crystal substrate 20 through the above steps S1 to S7.

Electrode Forming Step S8

A metal film is formed on a surface of the vibration substrate 2 and the metal film is patterned to form the electrode 3.

In this manner, the vibrator element 1 is obtained.

Although the preparation step S1, the first protective film forming step S2, the first dry etching step S3, the first protective film removing step S4, the second protective film forming step S5, the second dry etching step S6, the second protective film removing step S7, and the electrode forming step S8 are performed in this order in the present embodiment, the order of the steps S1, S2, S3, S4, S5, S6, S7, and S8 is not limited thereto. For example, the method may be performed in order of the step S1, the step S5, the step S6, the step S7, the step S2, the step S3, the step S4, and the step S8.

As described above, the present embodiment can obtain the following effects.

The vibrator element 1 includes the first vibration arm 22 and the second vibration arm 23 that extend along the Y direction which is a first direction and that are arranged side by side along the X direction which is a second direction intersecting the Y direction. The first vibration arm 22 and the second vibration arm 23 each have the first surface 2A and the second surface 2B that are arranged side by side in the Z direction which is a third direction intersecting the Y direction and the X direction and that are in a front and back relationship, and respectively have the bottomed first grooves 221 and 231 that open to the first surface 2A, and the bottomed second grooves 222 and 232 that open to the second surface 2B. A method for manufacturing the vibrator element 1 includes the preparation step S1 of preparing the quartz crystal substrate 20 having the first substrate surface 20A and the second substrate surface 20B that are in a front and back relationship, the first protective film forming step S2 of forming the first protective film 5 on the first substrate surface 20A, the first dry etching step S3 of dry etching the quartz crystal substrate 20 from the first substrate surface 20A side via the first protective film 5 to form the first surface 2A, the first grooves 221 and 231, and the outer shapes of the first vibration arm 22 and the second vibration arm 23, the second protective film forming step S5 of forming the second protective film 6 on the second substrate surface 20B, and the second dry etching step S6 of dry etching the quartz crystal substrate 20 from the second substrate surface 20B side via the second protective film 6 to form the second surface 2B, the second grooves 222 and 232, and the outer shapes of the first vibration arm 22 and the second vibration arm 23. In the first dry etching step S3, the outer shapes of the first vibration arm 22 and the second vibration arm 23 are formed to be closer to the second substrate surface 20B in the Z direction than are the positions where the bottom surfaces 222A and 232A of the second grooves 222 and 232 are formed.

As a result, the outer shapes of the first and second vibration arms 22 and 23, the first grooves 221 and 231, and the second grooves 222 and 232 can be collectively formed, and there is no restriction on the setting of dimensions such as the width of the inter-arm region Q4, the width of the inter-element region Q5, the widths of the first grooves 221 and 231, and the widths of the second grooves 222 and 232, and it is possible to provide a method for manufacturing the vibrator element 1 having a high degree of freedom in design.

Since the second grooves 222 and 232 can be formed in the second dry etching step S6 without forming the second protective film 6 in the second groove forming region Q6 of the second substrate surface 20B in the second protective film forming step S5, the second grooves 222 and 232 can be formed in a short time.

2. Second Embodiment

A method for manufacturing the vibrator element 1 according to a second embodiment will be described with reference to FIG. 14. The same components as those of the first embodiment are denoted by the same reference numerals, and redundant description thereof will be omitted.

The second embodiment is similar to the first embodiment except that T1=0 and T11=0 for the first protective film 5.

Since the preparation step S1 is the same as that of the first embodiment, description thereof will be omitted, and the first protective film forming step S2 will be described.

First Protective Film Forming Step S2

Figure 14:
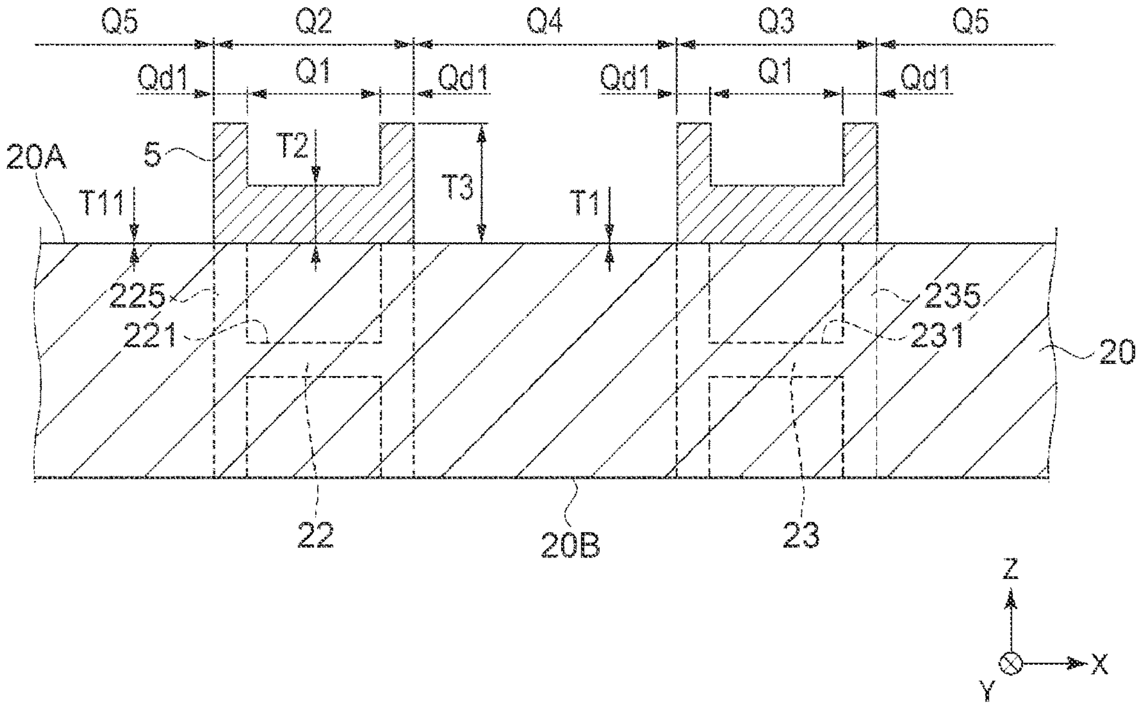
FIG. 14 is a cross sectional view showing a method for manufacturing a vibrator element according to a second embodiment.

As shown in FIG. 14, the first protective film 5 is formed on the first substrate surface 20A of the quartz crystal substrate 20. This step is performed in a similar manner to that in the first embodiment.

The thicknesses of the first protective film 5 satisfy T1<T2<T3 and T11<T2<T3.

In the present embodiment, the first protective film 5 is formed in the first vibration arm forming region Q2 and the second vibration arm forming region Q3 of the first substrate surface 20A, and the first protective film 5 is not formed in the inter-arm region Q4 and the inter-element region Q5 of the first substrate surface 20A. That is, T1=0 and T11=0 for the first protective film 5.

First Dry Etching Step S3

This step is performed in a similar manner to that in the first embodiment.

In the first dry etching step S3, the depths Aa and Ba of the outer shape of the vibration substrate 2 are formed to be larger than Ta−Wb which is a difference between the thickness Ta of the quartz crystal substrate 20 and the depth Wb of the second grooves 222 and 232.

In the present embodiment, since the first protective film 5 is not formed in the inter-arm region Q4 and the inter-element region Q5 of the first substrate surface 20A in the first protective film forming step S2, the etching of the quartz crystal substrate 20 in the inter-arm region Q4 and the inter-element region Q5 is started together with the start of the dry etching in the first dry etching step S3. Therefore, the first dry etching step S3 can be performed in a short time.

When the first dry etching step S3 is completed, the method proceeds to the first protective film removing step S4.

The first protective film removing step S4 and subsequent steps are the same as those of the first embodiment, and thus description thereof will be omitted.

In this manner, the vibrator element 1 is obtained.

As described above, the present embodiment can obtain the following effects in addition to the effects of the first embodiment.

Since the thickness of the first protective film 5 satisfies T1=0, the inter-arm region Q4 can be etched in a short time.

3. Third Embodiment

A method for manufacturing the vibrator element 1 according to a third embodiment will be described with reference to FIGS. 15 to 30. The same components as those of the first embodiment are denoted by the same reference numerals, and redundant description thereof will be omitted.

The third embodiment is similar to the first embodiment except that a first protective film **5*b* includes a first underlayer film 51 and a third protective film 53, the first protective film forming step S2 includes a first underlayer film forming step S100 and a third protective film forming step S110, a second protective film 6*b* includes a second underlayer film 61 and a fourth protective film 63, the second protective film forming step S5 includes a second underlayer film forming step S120 and a fourth protective film forming step S130, and T1=0 and T11=0 for the first protective film 5*b***.

Since the preparation step S1 is the same as that of the first embodiment, description thereof will be omitted, and the first protective film forming step S2 will be described.

First Protective Film Forming Step S2

Figure 15:
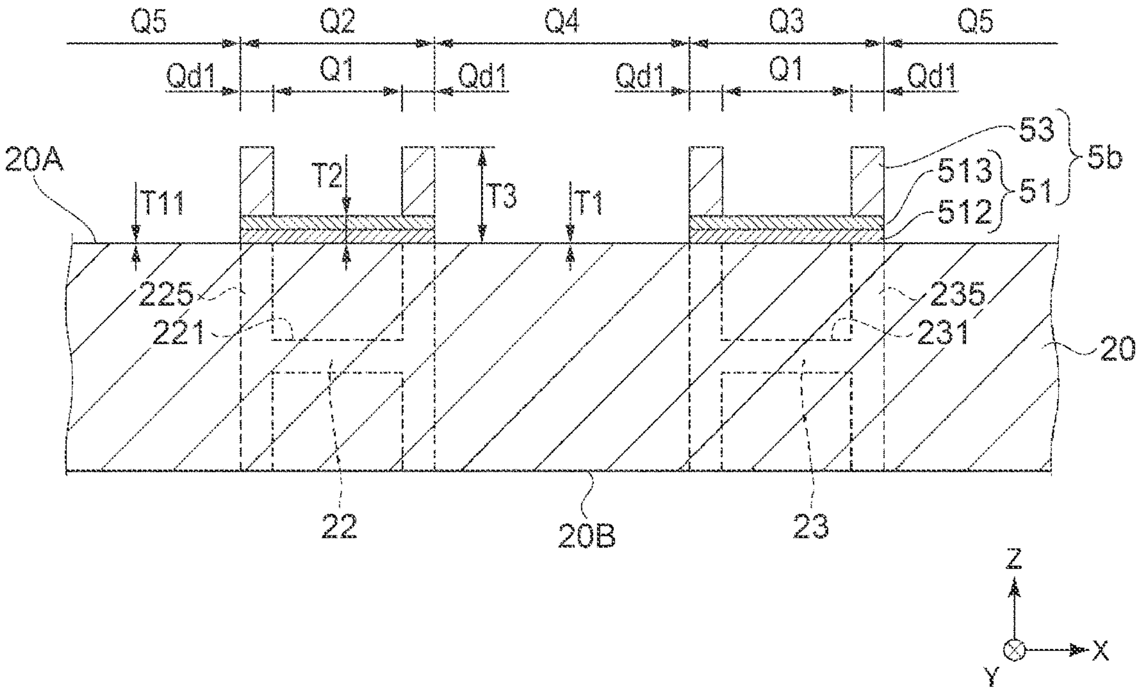
FIG. 15 is a cross sectional view showing a method for manufacturing a vibrator element according to a third embodiment.

As shown in FIG. 15, the first protective film **5*b* is formed on the first substrate surface 20A of the quartz crystal substrate 20. The first protective film 5*b* includes the first underlayer film 51 and the third protective film 53**.

The first protective film **5*b* is formed in the first vibration arm forming region Q2 and the second vibration arm forming region Q3 of the first substrate surface 20**A.

Specifically, the first underlayer film 51 of the first protective film **5*b* is formed in the first vibration arm forming region Q2 and the second vibration arm forming region Q3 of the first substrate surface 20A. The third protective film 53 of the first protective film 5*b* is formed in the first bank portion forming region Qd1 on a surface of the first underlayer film 51 at an opposite side from the quartz crystal substrate 20. The surface of the first underlayer film 51 at the opposite side from the quartz crystal substrate 20 is an upper surface of the first underlayer film 51**.

That is, the first underlayer film 51 is formed as the first protective film **5*b* in the first groove forming region Q1 of the first substrate surface 20A. The first underlayer film 51 and the third protective film 53 are formed as the first protective film 5*b* in the first bank portion forming region Qd1 of the first substrate surface 20A. The first underlayer film 51 and the third protective film 53 are stacked in this order along the positive side of the Z direction in the first bank portion forming region Qd1**.

A thickness T2 of the first protective film **5*b* in the first groove forming region Q1 of the first substrate surface 20A is a thickness of the first underlayer film 51. A thickness T3 of the first protective film 5*b* in the first bank portion forming region Qd1 of the first substrate surface 20A is a sum of the thickness of the first underlayer film 51 and a thickness of the third protective film 53. Since the first protective film 5*b* is not formed in the inter-arm region Q4 and the inter-element region Q5, the thicknesses T1 and T11 of the first protective film 5*b* in the inter-arm region Q4 and the inter-element region Q5 of the first substrate surface 20**A satisfy T1=0 and T11=0.

That is, the thicknesses of the first protective film **5*b* satisfy T1<T2<T3 and T11<T2<T3. Although T1=0 and T11=0 in the present embodiment, the thicknesses of the first protective film 5*b*** may be 0<T1 and 0<T11 as long as T1<T2<T3 and T11<T2<T3.

The first underlayer film 51 will be described.

The first underlayer film 51 is made of a material that is etched at a predetermined etching rate in the first dry etching step S3.

In the present embodiment, the first underlayer film 51 is a metal film made of a metal. The first underlayer film 51 is formed by stacking a first metal film 512 and a second metal film 513. The first metal film 512 is formed on the first substrate surface 20A of the quartz crystal substrate 20. The second metal film 513 is formed on a surface of the first metal film 512 at an opposite side from the quartz crystal substrate 20. The surface of the first metal film 512 at the opposite side from the quartz crystal substrate 20 is an upper surface of the first metal film 512. The first metal film 512 is made of chromium (Cr). The second metal film 513 is made of copper (Cu).

Although the first underlayer film 51 is formed by stacking the first metal film 512 and the second metal film 513 in the present embodiment, the disclosure is not limited thereto, and the first underlayer film 51 may be formed of one film, or may be formed by stacking three or more films.

The first underlayer film 51 may be made of a material other than metal. For example, the first underlayer film 51 may be a resist film made of a resist material. In a case where the first underlayer film 51 is a metal film, the thickness of the first underlayer film 51 can be made smaller than that in a case where the first underlayer film 51 is a resist film. Accordingly, dimensional accuracy of the first and second vibration arms 22 and 23, the first grooves 221 and 231, and the like formed in the first dry etching step S3 can be improved.

Next, the third protective film 53 will be described.

The third protective film 53 is made of a material that is etched at a predetermined etching rate in the first dry etching step S3.

In the present embodiment, the third protective film 53 is a metal film made of a metal. For example, nickel (Ni) can be used as the metal for forming the third protective film 53. The third protective film 53 may be made of a material other than metal. For example, the third protective film 53 may be a resist film made of a resist material. In a case where the third protective film 53 is a metal film, the thickness of the third protective film 53 can be made smaller than that in a case where the third protective film 53 is a resist film. Accordingly, dimensional accuracy of the first and second vibration arms 22 and 23, the first grooves 221 and 231, and the like formed in the first dry etching step S3 can be further improved.

Next, a method for forming the first protective film **5*b*** will be described.

Figure 16:
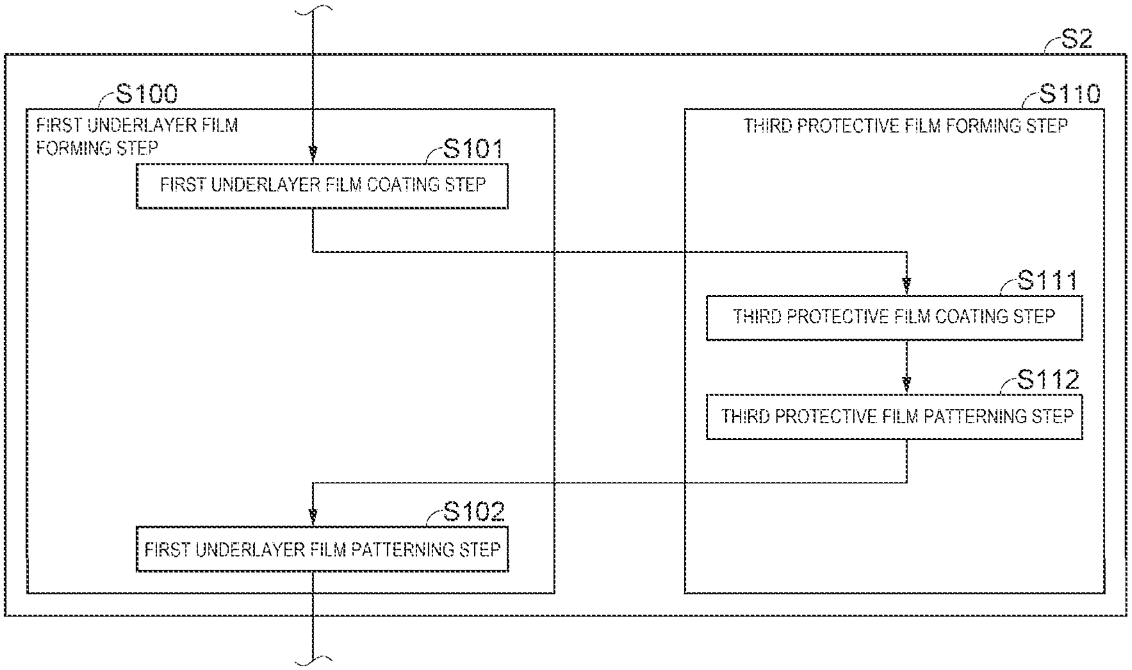
FIG. 16 is a diagram showing a first protective film forming step.

As shown in FIG. 16, the first protective film forming step S2 includes the first underlayer film forming step S100 and the third protective film forming step S110 in the present embodiment.

The first underlayer film forming step S100 is a step of forming the first underlayer film 51 on the first substrate surface 20A of the quartz crystal substrate 20 in the first vibration arm forming region Q2 in which the first vibration arm 22 is formed and the second vibration arm forming region Q3 in which the second vibration arm 23 is formed.

The first underlayer film forming step S100 includes a first underlayer film coating step S101 of coating the first substrate surface 20A of the quartz crystal substrate 20 with the first underlayer film 51, and a first underlayer film patterning step S102 of patterning the first underlayer film 51.

The first underlayer film 51 is also referred to as the underlayer film 51, and the first underlayer film forming step S100 is also referred to as the underlayer film forming step S100.

The third protective film forming step S110 is a step of forming, on the first underlayer film 51 formed in the first underlayer film forming step S100, the third protective film 53 in the first bank portion forming region Qd1 which is a region excluding the first groove forming region Q1 in which the first grooves 221 and 231 are formed.

The third protective film forming step S110 includes a third protective film coating step S111 of coating the first underlayer film 51 with the third protective film 53, and a third protective film patterning step S112 of patterning the third protective film 53.

Although the first underlayer film coating step S101, the third protective film coating step S111, the third protective film patterning step S112, and the first underlayer film patterning step S102 are performed in this order in the present embodiment, the order of the steps S101, S102, S111, and S112 is not limited thereto. For example, the method may be performed in order of the step S101, the step S102, the step S111, and the step S112, or may be performed in order of the step S101, the step S111, the step S102, and the step S112.

First Underlayer Film Coating Step S101

Figure 17:
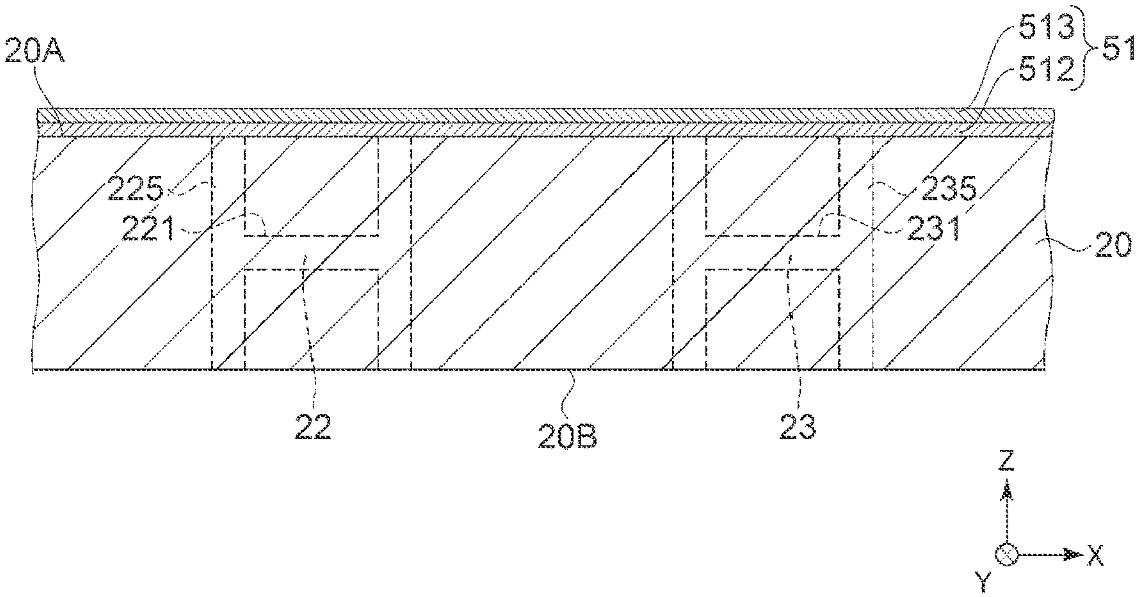
FIG. 17 is a cross sectional view showing a method for forming a first protective film.

As shown in FIG. 17, the first substrate surface 20A of the quartz crystal substrate 20 is covered with the first underlayer film 51.

Third Protective Film Coating Step S111

Figure 18:
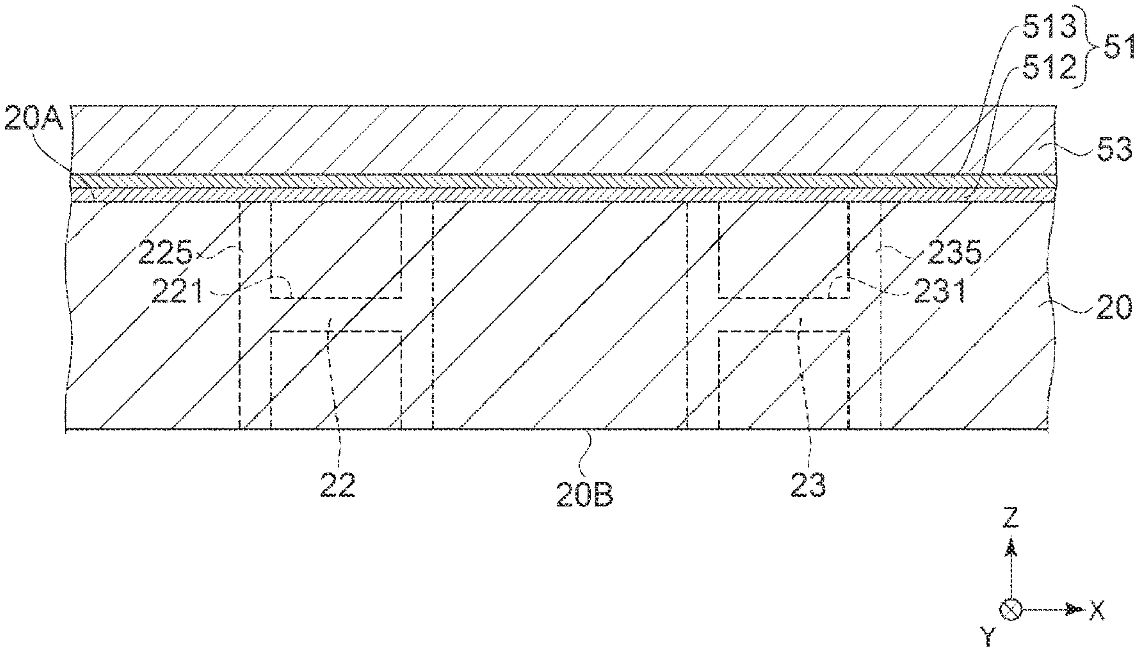
FIG. 18 is a cross sectional view showing the method for forming the first protective film.

As shown in FIG. 18, the first underlayer film 51 is covered with the third protective film 53. The third protective film 53 is formed on the surface of the first underlayer film 51 at an opposite side from the quartz crystal substrate 20.

Third Protective Film Patterning Step S112

Figure 19:
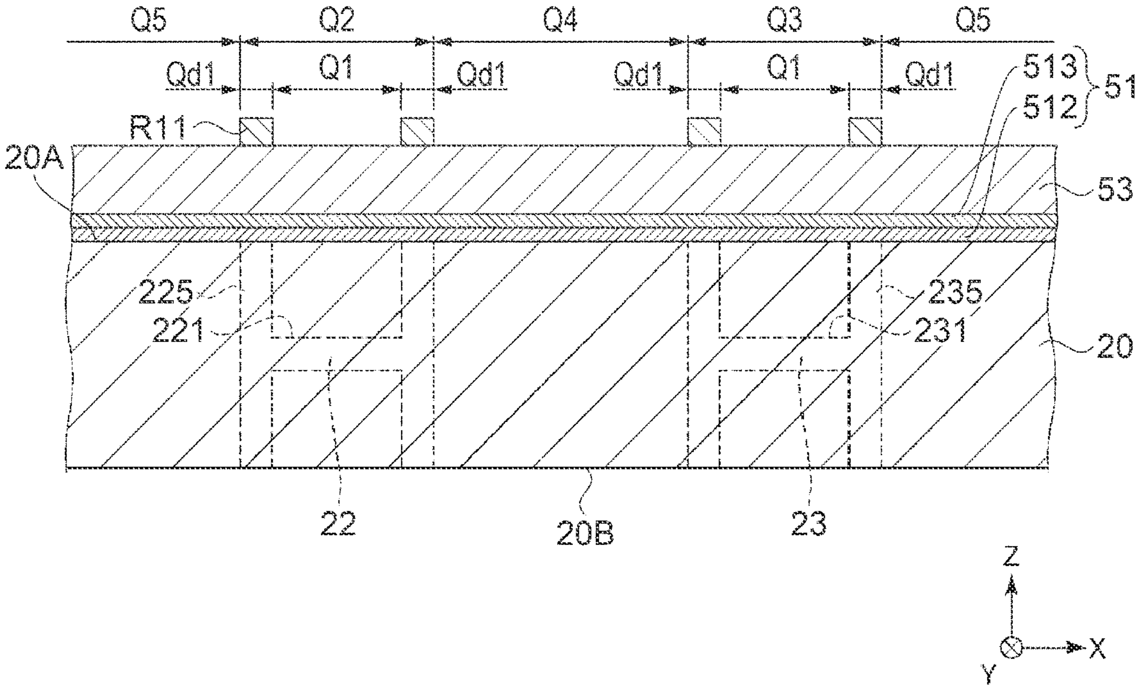
FIG. 19 is a cross sectional view showing the method for forming the first protective film.

First, as shown in FIG. 19, a second resist film R11 is formed on a surface of the third protective film 53 at an opposite side from the quartz crystal substrate 20. The surface of the third protective film 53 at the opposite side from the quartz crystal substrate 20 is an upper surface of the third protective film 53. The second resist film R11 is formed in the first bank portion forming region Qd1 using a photolithography technique. That is, the second resist film R11 overlaps the first bank portion forming region Qd1 in a plan view.

Next, the third protective film 53 is etched from a surface side of the third protective film 53 where the second resist film R11 is formed. That is, the third protective film 53 is etched from the upper surface side of the third protective film 53 using the second resist film R11 as a mask. As a result, the third protective film 53 in the first groove forming region Q1, the inter-arm region Q4, and the inter-element region Q5 in which the second resist film R11 is not formed is removed.

Figure 20:
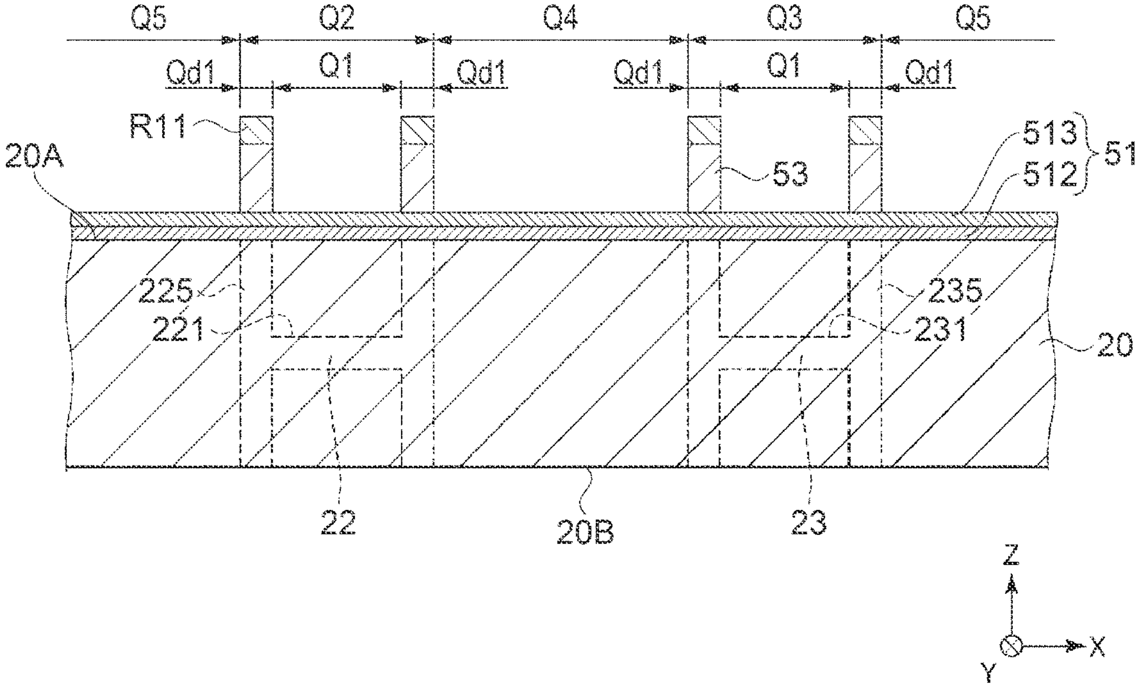
FIG. 20 is a cross sectional view showing the method for forming the first protective film.

In this manner, as shown in FIG. 20, the third protective film 53 can be formed on the upper surface of the first underlayer film 51 in the first bank portion forming region Qd1.

Figure 21:
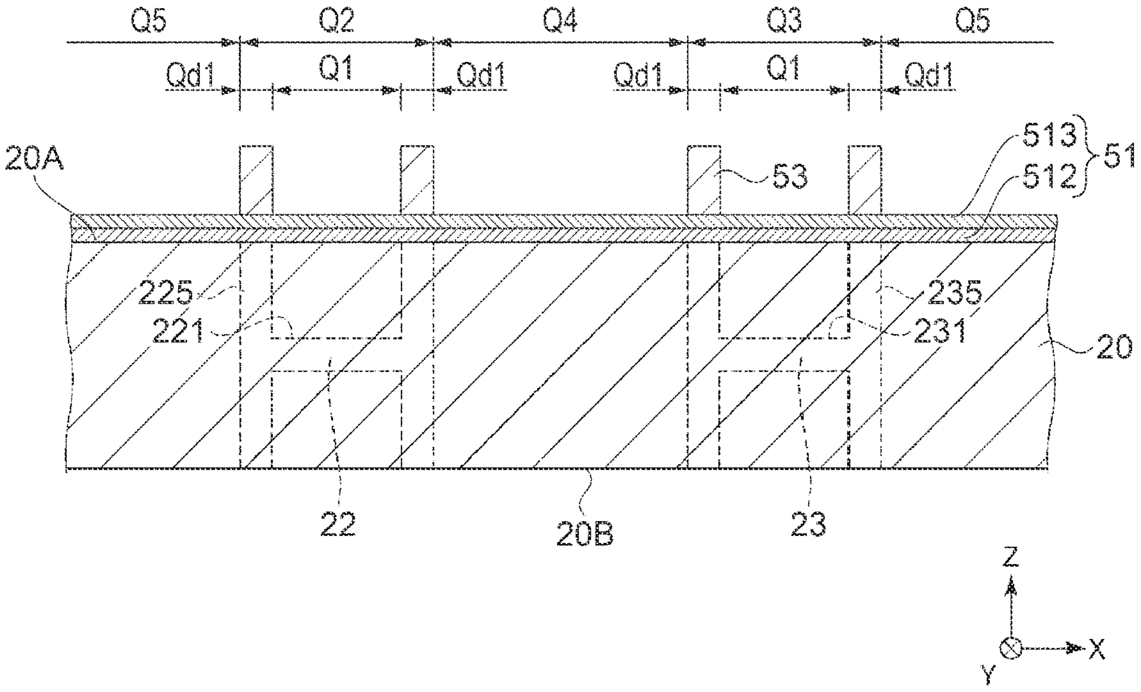
FIG. 21 is a cross sectional view showing the method for forming the first protective film.

Next, as shown in FIG. 21, the second resist film R11 is removed, and the method proceeds to the first underlayer film patterning step S102.

First Underlayer Film Patterning Step S102

Figure 22:
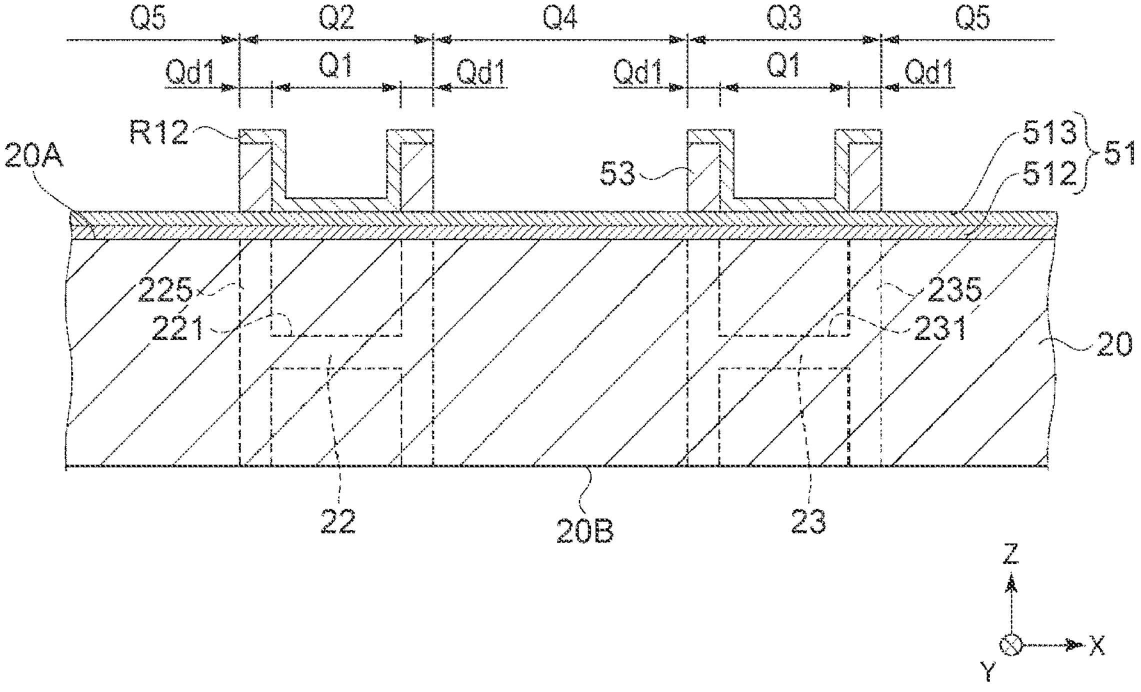
FIG. 22 is a cross sectional view showing the method for forming the first protective film.

First, as shown in FIG. 22, a third resist film R12 is formed on the first underlayer film 51 in the first vibration arm forming region Q2 and the second vibration arm forming region Q3 by using a photolithography technique.

In the present embodiment, prior to the first underlayer film patterning step S102, the third protective film 53 is formed in the first bank portion forming region Qd1. Therefore, the third resist film R12 is formed on the first underlayer film 51 in a manner of covering the first underlayer film 51 with the third protective film 53 in the first bank portion forming region Qd1 interposed therebetween. The third resist film R12 is formed on the first underlayer film 51 in a manner of covering the upper surface of the first underlayer film 51 without the third protective film 53 being interposed between the third resist film R12 and the first underlayer film 51 in the first groove forming region Q1.

Next, the first underlayer film 51 is etched via the third resist film R12 from a surface side of the first underlayer film 51 where the third resist film R12 is formed. That is, the first underlayer film 51 is etched from the upper surface side of the first underlayer film 51 using the third resist film R12 as a mask.

The third resist film R12 is formed in the first vibration arm forming region Q2 and the second vibration arm forming region Q3, and is not formed in the inter-arm region Q4 and the inter-element region Q5. Therefore, the first underlayer film 51 in the inter-arm region Q4 and the inter-element region Q5 is removed in the first underlayer film patterning step S102.

Figure 23:
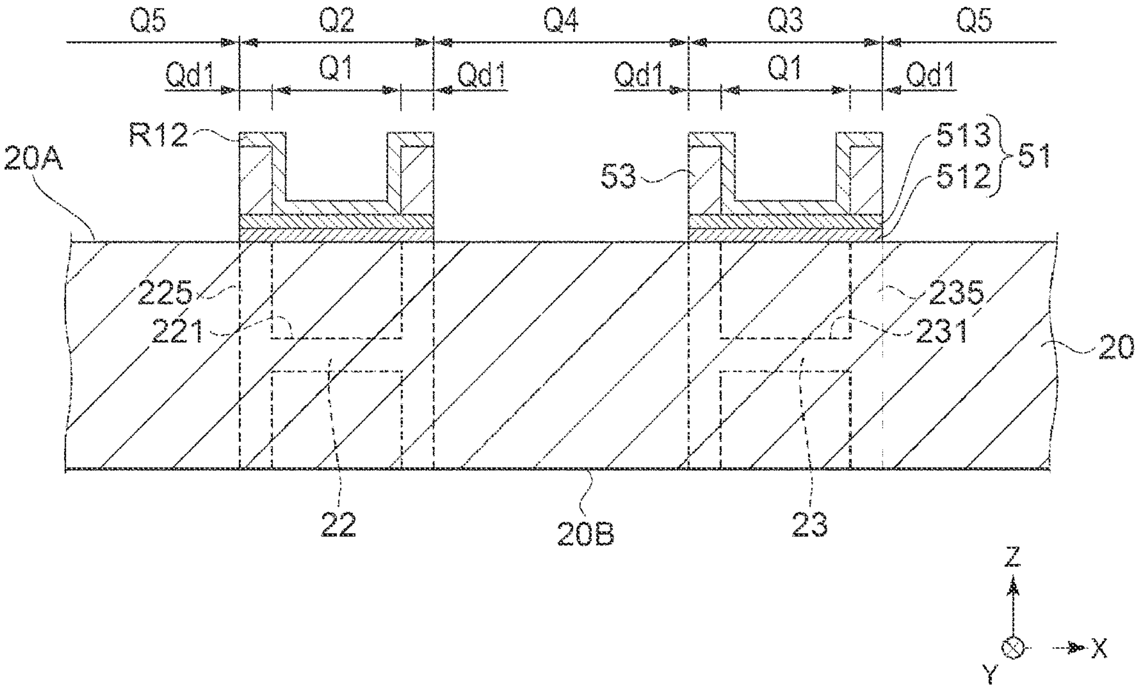
FIG. 23 is a cross sectional view showing the method for forming the first protective film.

In this manner, as shown in FIG. 23, the first underlayer film 51 is formed in the first vibration arm forming region Q2 and the second vibration arm forming region Q3 of the first substrate surface 20A.

Next, the third resist film R12 is removed. In this manner, the first protective film 5*b* shown in FIG. 15 is formed.

When the removal of the third resist film R12 is completed, the method proceeds to the first dry etching step S3.

First Dry Etching Step S3

This step is performed in a similar manner to that in the first embodiment.

Figure 24:
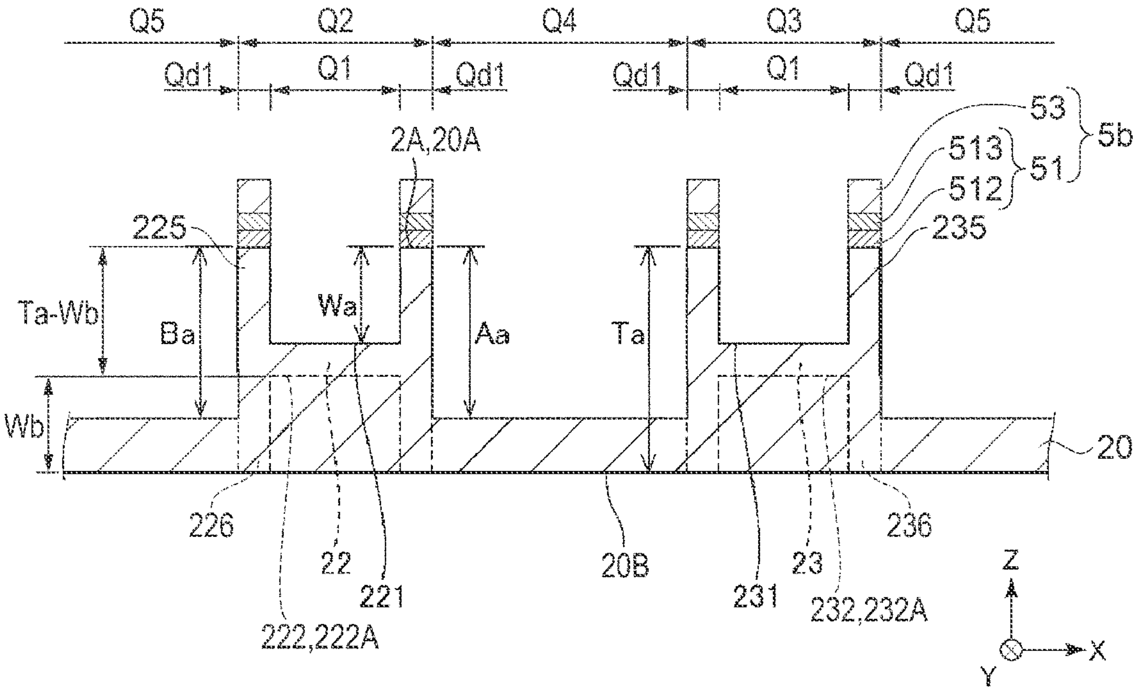
FIG. 24 is a cross sectional view showing the method for manufacturing the vibrator element.

As shown in FIG. 24, the quartz crystal substrate 20 is dry etched from the first substrate surface 20A side via the first protective film 5*b*, and the first surface 2A, the first grooves 221 and 231, and the outer shape of the vibration substrate 2 are simultaneously formed.

In the first dry etching step S3, the first underlayer film 51 and the third protective film 53 formed on the first substrate surface 20A of the quartz crystal substrate 20 are etched at respective predetermined etching rates. Therefore, respective etching depths of the quartz crystal substrate 20 in a region in which the first substrate surface 20A is exposed without forming the first protective film 5*b*, a region in which the first underlayer film 51 is formed as the first protective film 5*b*, and a region in which the first underlayer film 51 and the third protective film 53 are formed as the first protective film 5*b* can be controlled by the first underlayer film 51 and the third protective film 53.

That is, the first protective film 5*b* including the first underlayer film 51 and the third protective film 53 is formed in the first protective film forming step S2, so that the outer shapes of the first and second vibration arms 22 and 23 and the first grooves 221 and 231 can be collectively formed without using a micro loading effect in the first dry etching step S3.

In addition, the first protective film 5*b* including the first underlayer film 51 and the third protective film 53 is formed in the first protective film forming step S2, so that it is possible to form the depths Aa and Ba of the outer shape of the vibration substrate 2 to be larger than Ta−Wb which is a difference between the thickness Ta of the quartz crystal substrate 20 and the depth Wb of the second grooves 222 and 232 in the first dry etching step S3.

As described above, in the present embodiment, the first protective film 5*b* is not formed in the inter-arm region Q4 and the inter-element region Q5 of the first substrate surface 20A in the first protective film forming step S2. That is, T1=0 and T11=0 for the first protective film 5*b*. In other words, the first underlayer film 51 is not formed in the inter-arm region Q4 and the inter-element region Q5 of the first substrate surface 20A.

As described above, since the first protective film 5*b* is not formed in the inter-arm region Q4 and the inter-element region Q5 of the first substrate surface 20A, the etching of the quartz crystal substrate 20 in the inter-arm region Q4 and the inter-element region Q5 is started together with the start of the dry etching in the first dry etching step S3. Therefore, the first dry etching step S3 can be performed in a short time.

Although the first dry etching step S3 is ended in a state in which the first protective film 5*b* remains in the first bank portion forming region Qd1 of the first substrate surface 20A in the present embodiment, the first dry etching step S3 may be ended in a state in which the first protective film 5*b* does not remain in the first bank portion forming region Qd1 of the first substrate surface 20A.

When the first dry etching step S3 is completed, the method proceeds to the first protective film removing step S4.

Since the first protective film removing step S4 is the same as that of the first embodiment, description thereof will be omitted, and the second protective film forming step S5 will be described. After the completion of the first protective film removing step S4, the method proceeds to a processing of the second substrate surface 20B of the quartz crystal substrate 20.

Second Protective Film Forming Step S5

Figure 25:
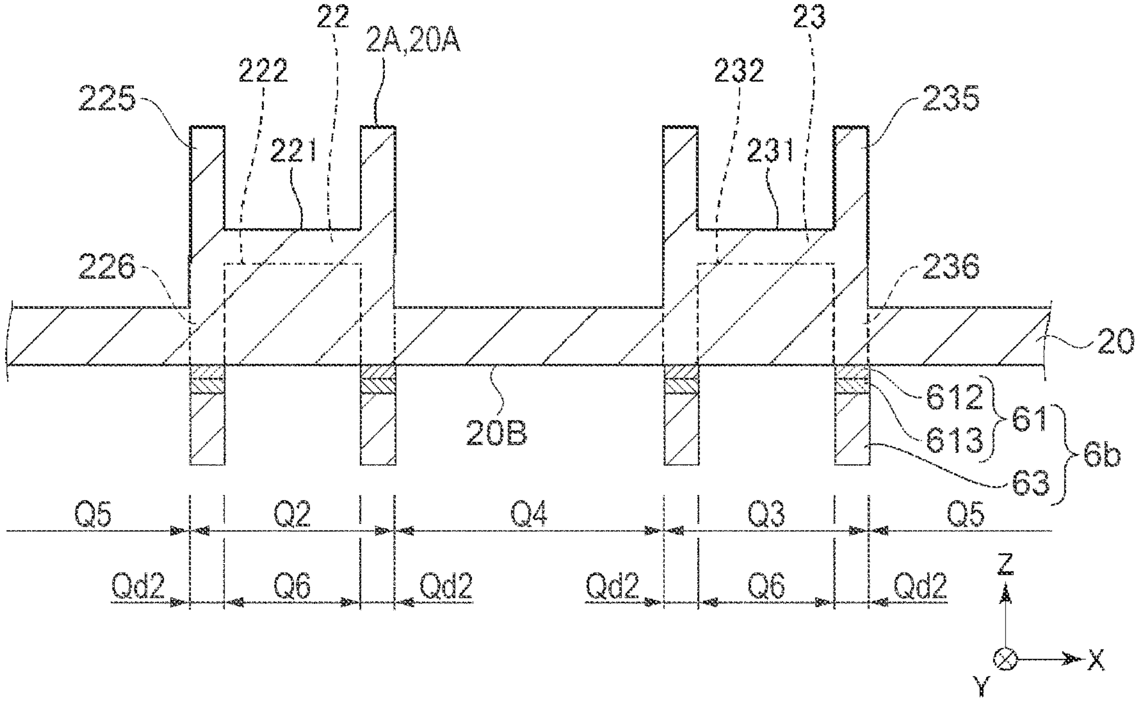
FIG. 25 is a cross sectional view showing the method for manufacturing the vibrator element.

As shown in FIG. 25, the second protective film 6*b* is formed on the second substrate surface 20B of the quartz crystal substrate 20. The second protective film 6*b* includes the second underlayer film 61 and the fourth protective film 63.

The second protective film 6*b* is formed in the second bank portion forming region Qd2 of the second substrate surface 20B.

Specifically, the second underlayer film 61 of the second protective film 6*b* is formed in the second bank portion forming region Qd2 of the second substrate surface 20B. The fourth protective film 63 of the second protective film 6*b* is formed in the second bank portion forming region Qd2 on a surface of the second underlayer film 61 at an opposite side from the quartz crystal substrate 20. The surface of the second underlayer film 61 at the opposite side from the quartz crystal substrate 20 is a lower surface of the second underlayer film 61.

That is, the second underlayer film 61 and the fourth protective film 63 are formed as the second protective film 6*b* in the second bank portion forming region Qd2 of the second substrate surface 20B. The second underlayer film 61 and the fourth protective film 63 are stacked in this order along the negative side of the Z direction in the second bank portion forming region Qd2.

The second underlayer film 61 will be described.

The second underlayer film 61 is made of a material that is etched at a predetermined etching rate in the second dry etching step S6.

In the present embodiment, the second underlayer film 61 is a metal film made of a metal. The second underlayer film 61 is formed by stacking a first metal film 612 and a second metal film 613.

Although the second underlayer film 61 is formed by stacking the first metal film 612 and the second metal film 613 in the present embodiment, the disclosure is not limited thereto, and the second underlayer film 61 may be formed of one film, or may be formed by stacking three or more films.

The second underlayer film 61 may be formed of a material other than metal. For example, the second underlayer film 61 may be a resist film made of a resist material.

Next, the fourth protective film 63 will be described.

The fourth protective film 63 is made of a material that is etched at a predetermined etching rate in the second dry etching step S6.

In the present embodiment, the fourth protective film 63 is a metal film made of a metal. For example, nickel (Ni) can be used as the metal for forming the fourth protective film 63. The fourth protective film 63 may be made of a material other than metal. For example, the fourth protective film 63 may be a resist film made of a resist material.

Next, a method for forming the second protective film 6*b* will be described.

Figure 26:
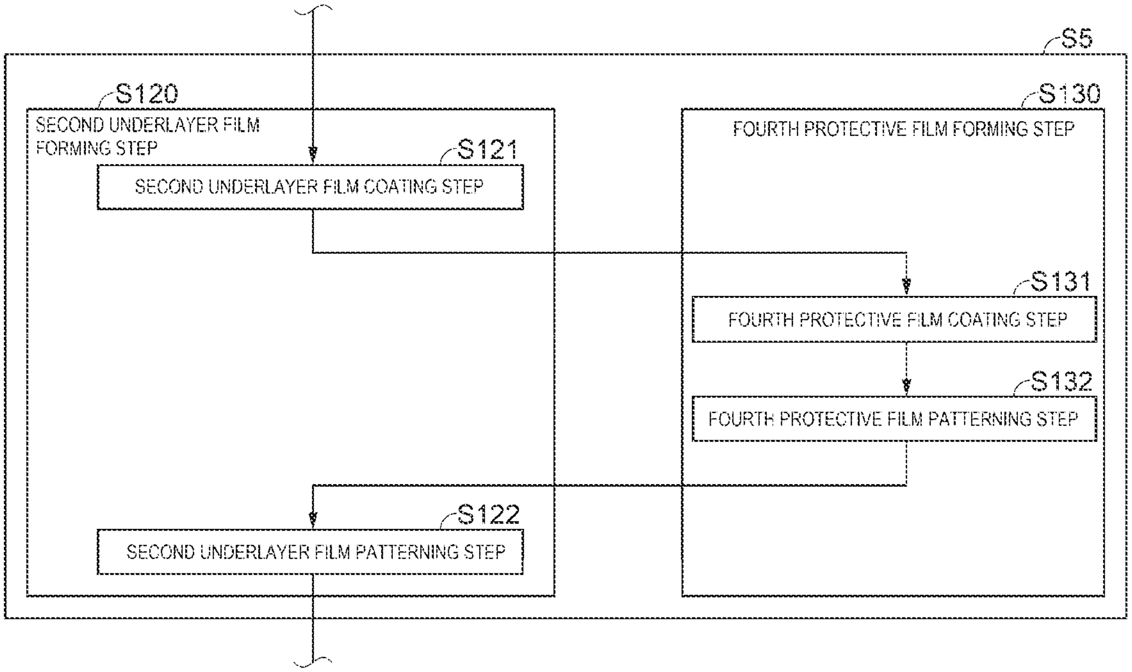
FIG. 26 is a diagram showing a second protective film forming step.

As shown in FIG. 26, the second protective film forming step S5 includes the second underlayer film forming step S120 and the fourth protective film forming step S130 in the present embodiment.

The second underlayer film forming step S120 is a step of forming the second underlayer film 61 in the second bank portion forming region Qd2 on the second substrate surface 20B of the quartz crystal substrate 20.

The second underlayer film forming step S120 includes a second underlayer film coating step S121 of coating the second substrate surface 20B of the quartz crystal substrate 20 with the second underlayer film 61, and a second underlayer film patterning step S122 of patterning the second underlayer film 61.

The fourth protective film forming step S130 is a step of forming the fourth protective film 63 in the second bank portion forming region Qd2 on the second underlayer film 61 formed in the second underlayer film forming step S120.

The fourth protective film forming step S130 includes a fourth protective film coating step S131 of coating the second underlayer film 61 with the fourth protective film 63, and a fourth protective film patterning step S132 of patterning the fourth protective film 63.

Although the second underlayer film coating step S121, the fourth protective film coating step S131, the fourth protective film patterning step S132, and the second underlayer film patterning step S122 are performed in this order in the present embodiment, the order of the steps S121, S122, S131, and S132 is not limited thereto. For example, the method may be performed in order of the step S121, the step S122, the step S131, and the step S132.

Second Underlayer Film Coating Step S121

Figure 27:
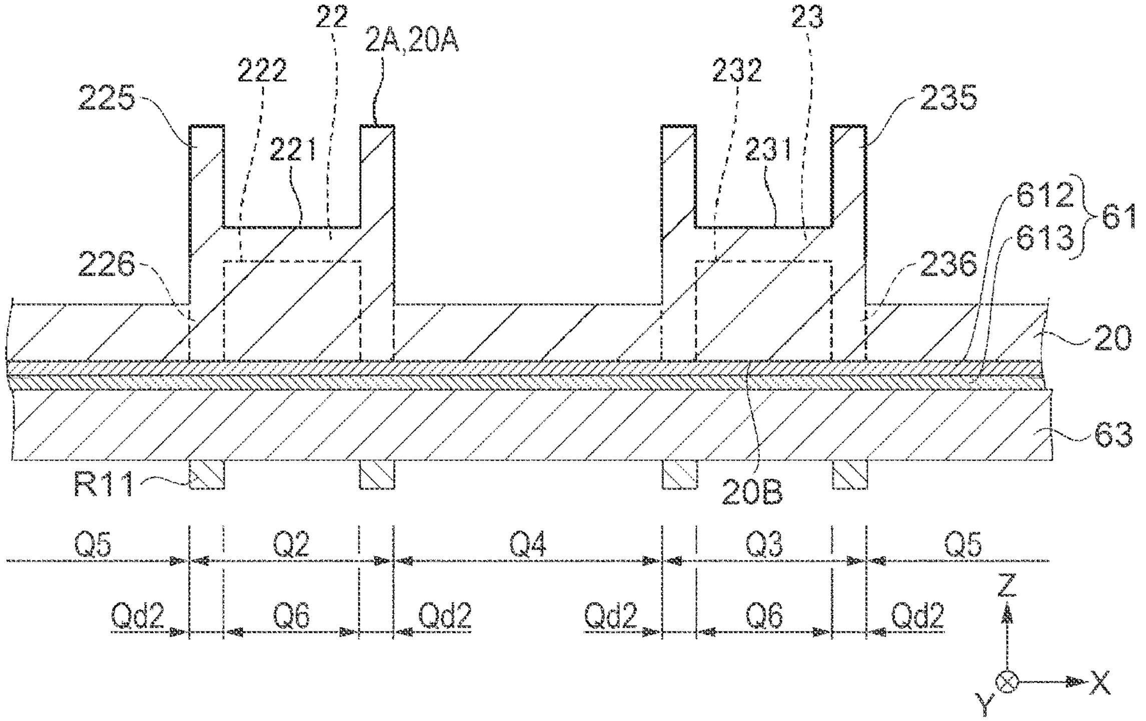
FIG. 27 is a cross sectional view showing a method for forming a second protective film.

As shown in FIG. 27, the second substrate surface 20B of the quartz crystal substrate 20 is covered with the second underlayer film 61.

Fourth Protective Film Coating Step S131

As shown in FIG. 27, the second underlayer film 61 is covered with the fourth protective film 63. The fourth protective film 63 is formed on a surface of the second underlayer film 61 at an opposite side from the quartz crystal substrate 20.

Fourth Protective Film Patterning Step S132

First, as shown in FIG. 27, the second resist film R11 is formed on a surface of the fourth protective film 63 at an opposite side from the quartz crystal substrate 20. The surface of the fourth protective film 63 at the opposite side from the quartz crystal substrate 20 is a lower surface of the fourth protective film 63. The second resist film R11 is formed in the second bank portion forming region Qd2 using a photolithography technique. That is, the second resist film R11 overlaps the second bank portion forming region Qd2 in a plan view.

Next, the fourth protective film 63 is etched from a surface side of the fourth protective film 63 where the second resist film R11 is formed. That is, the fourth protective film 63 is etched from a lower surface side of the fourth protective film 63 using the second resist film R11 as a mask. As a result, as shown in FIG. 28, the fourth protective film 63 in the second groove forming region Q6, the inter-arm region Q4, and the inter-element region Q5 in which the second resist film R11 is not formed is removed.

Figure 28:
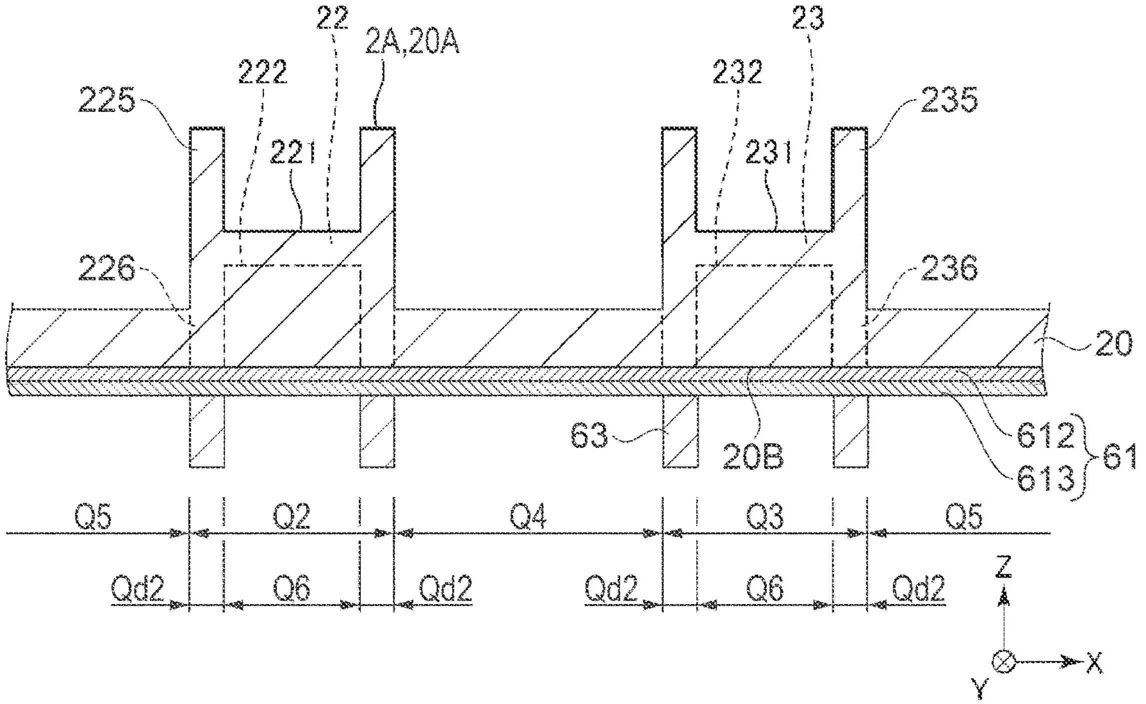
FIG. 28 is a cross sectional view showing the method for forming the second protective film.

Next, as shown in FIG. 28, the second resist film R11 is removed, and the method proceeds to the second underlayer film patterning step S122.

Second Underlayer Film Patterning Step S122

Figure 29:
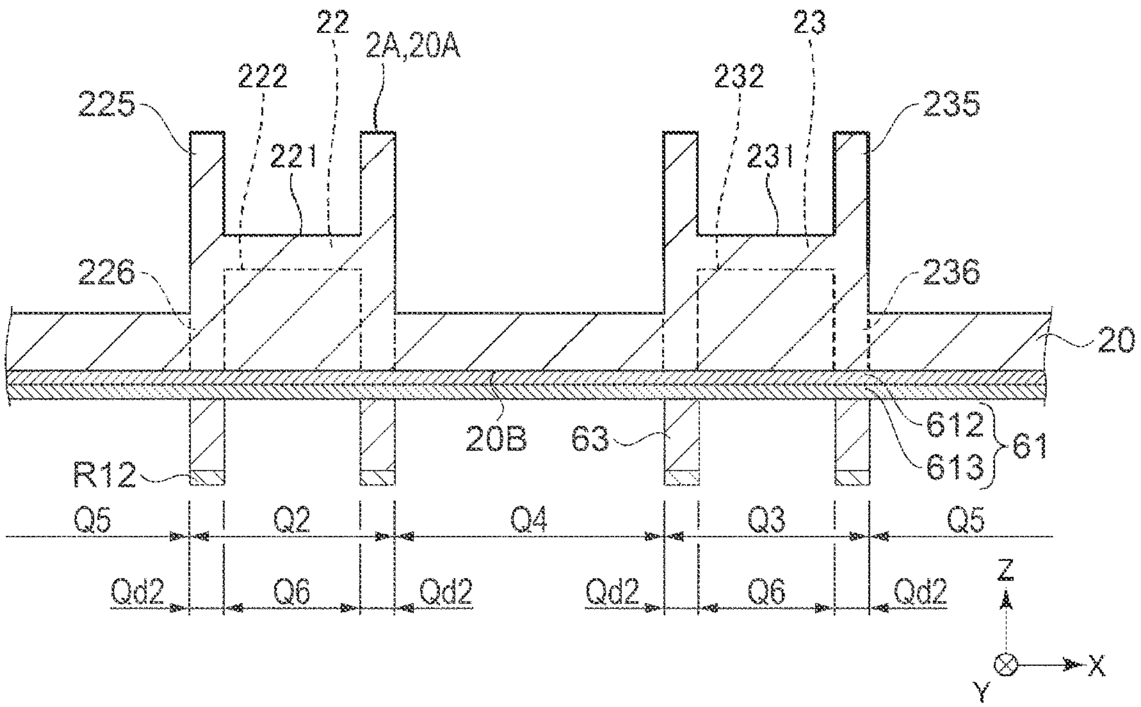
FIG. 29 is a cross sectional view showing the method for forming the second protective film.

First, as shown in FIG. 29, the third resist film R12 is formed on the second underlayer film 61 in the second bank portion forming region Qd2 using a photolithography technique.

In the present embodiment, prior to the second underlayer film patterning step S122, the fourth protective film 63 is formed in the second bank portion forming region Qd2. Therefore, the third resist film R12 is formed on the second underlayer film 61 in a manner of covering the second underlayer film 61 with the fourth protective film 63 in the second bank portion forming region Qd2 interposed therebetween.

Next, the second underlayer film 61 is etched via the third resist film R12 from a surface side of the second underlayer film 61 where the third resist film R12 is formed. That is, the second underlayer film 61 is etched from a lower surface side of the second underlayer film 61 using the third resist film R12 as a mask.

The third resist film R12 is formed in the second bank portion forming region Qd2, and is not formed in the second groove forming region Q6, the inter-arm region Q4, and the inter-element region Q5. Therefore, the second underlayer film 61 in the second groove forming region Q6, the inter-arm region Q4, and the inter-element region Q5 is removed in the second underlayer film patterning step S122.

In this manner, the second underlayer film 61 is formed in the second bank portion forming region Qd2 of the second substrate surface 20B.

Next, the third resist film R12 is removed. In this manner, the second protective film 6*b* shown in FIG. 25 is formed.

When the removal of the third resist film R12 is completed, the method proceeds to the second dry etching step S6.

Second Dry Etching Step S6

This step is performed in a similar manner to that in the first embodiment.

Figure 30:
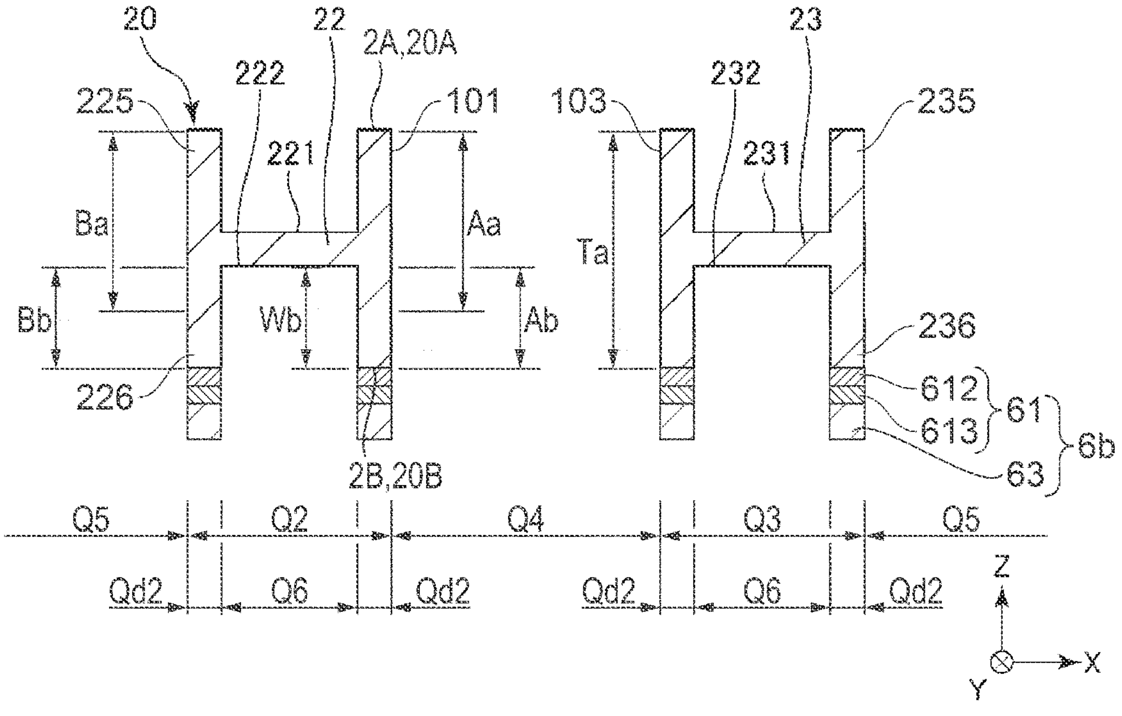
FIG. 30 is a cross sectional view showing the method for manufacturing the vibrator element.

As shown in FIG. 30, the quartz crystal substrate 20 is dry etched from the second substrate surface 20B side via the second protective film 6*b*, and the second surface 2B, the second grooves 222 and 232, and the outer shape of the vibration substrate 2 are simultaneously formed.

Since the second protective film 6*b* is not formed in the inter-arm region Q4, the inter-element region Q5, and the second groove forming region Q6 of the second substrate surface 20B, the depth Wb of the second grooves 222 and 232 is made substantially equal to the depths Ab and Bb of the outer shape of the vibration substrate 2 by performing dry etching in the second dry etching step S6.

In this manner, the second protective film 6*b* including the second underlayer film 61 and the fourth protective film 63 is formed in the second protective film forming step S5, so that the outer shapes of the first and second vibration arms 22 and 23 and the second grooves 222 and 232 can be collectively formed without using a micro loading effect in the second dry etching step S6.

Since the outer shapes of the first vibration arm 22 and the second vibration arm 23 are formed to be closer to the second substrate surface 20B in the Z direction than are the positions where the bottom surfaces 222A and 232A of the second grooves 222 and 232 are formed in the first dry etching step S3, even when the second protective film 6*b* is not formed in the second groove forming region Q6 of the second substrate surface 20B in the second protective film forming step S5, the inter-arm region Q4 and the inter-element region Q5 can be penetrated in the second dry etching step S6.

Since the second protective film 6*b* is not formed in the second groove forming region Q6 of the second substrate surface 20B, the second grooves 222 and 232 can be formed in a short time in the second dry etching step S6.

Since the second protective film 6*b* is not formed in the inter-arm region Q4 and the inter-element region Q5 of the second substrate surface 20B, the inter-arm region Q4 and the inter-element region Q5 can be penetrated in a short time in the second dry etching step S6.

Although the second dry etching step S6 is ended in a state in which the second protective film 6*b* remains in the second bank portion forming region Qd2 of the second substrate surface 20B in the present embodiment, the second dry etching step S6 may be ended in a state in which the second protective film 6*b* does not remain in the second bank portion forming region Qd2 of the second substrate surface 20B.

When the second dry etching step S6 is ended, the method proceeds to the second protective film removing step S7.

The second protective film removing step S7 and subsequent steps are the same as those of the first embodiment, and thus description thereof will be omitted.

In this manner, the vibrator element 1 is obtained.

Although the second underlayer film 61 is formed in the second bank portion forming region Qd2 of the second substrate surface 20B, and is not formed in the second groove forming region Q6, the inter-arm region Q4, and the inter-element region Q5 in the second underlayer film forming step S120 in the present embodiment, the second underlayer film 61 may be formed in the second groove forming region Q6, the inter-arm region Q4, and the inter-element region Q5. That is, as shown in FIG. 28, the second underlayer film 61 may be formed in the second bank portion forming region Qd2, the second groove forming region Q6, the inter-arm region Q4, and the inter-element region Q5 of the second substrate surface 20B.

In such a case, the depth Wb of the second grooves 222 and 232 is also made substantially equal to the depths Ab and Bb of the outer shape of the vibration substrate 2 by performing dry etching in the second dry etching step S6. Therefore, the inter-arm region Q4 and the inter-element region Q5 can be penetrated, and the first vibration arm 22 and the second vibration arm 23 can be formed. Since it is not necessary to remove the second underlayer film 61 from the second groove forming region Q6, the inter-arm region Q4, and the inter-element region Q5, the second underlayer film patterning step S122 can be omitted, and the second protective film forming step S5 can be simplified.

As described above, the present embodiment can obtain the following effects.

By forming the first protective film 5*b* including the first underlayer film 51 and the third protective film 53, the same effects as those of the first embodiment can be obtained.

Since the first underlayer film 51 is not formed in the inter-arm region Q4, that is, T1=0, the same effects as those of the second embodiment can be obtained.

A method for manufacturing the vibrator element 1 has been described above based on the first embodiment, the second embodiment, and the third embodiment. The present disclosure is not limited thereto, and a configuration of each part can be replaced with any configuration having the same function. In addition, any other constituents may be added to the present disclosure. The embodiments may be combined as appropriate.

The vibrator element manufactured using the method for manufacturing a vibrator element according to the present disclosure is not particularly limited.

Figure 31:
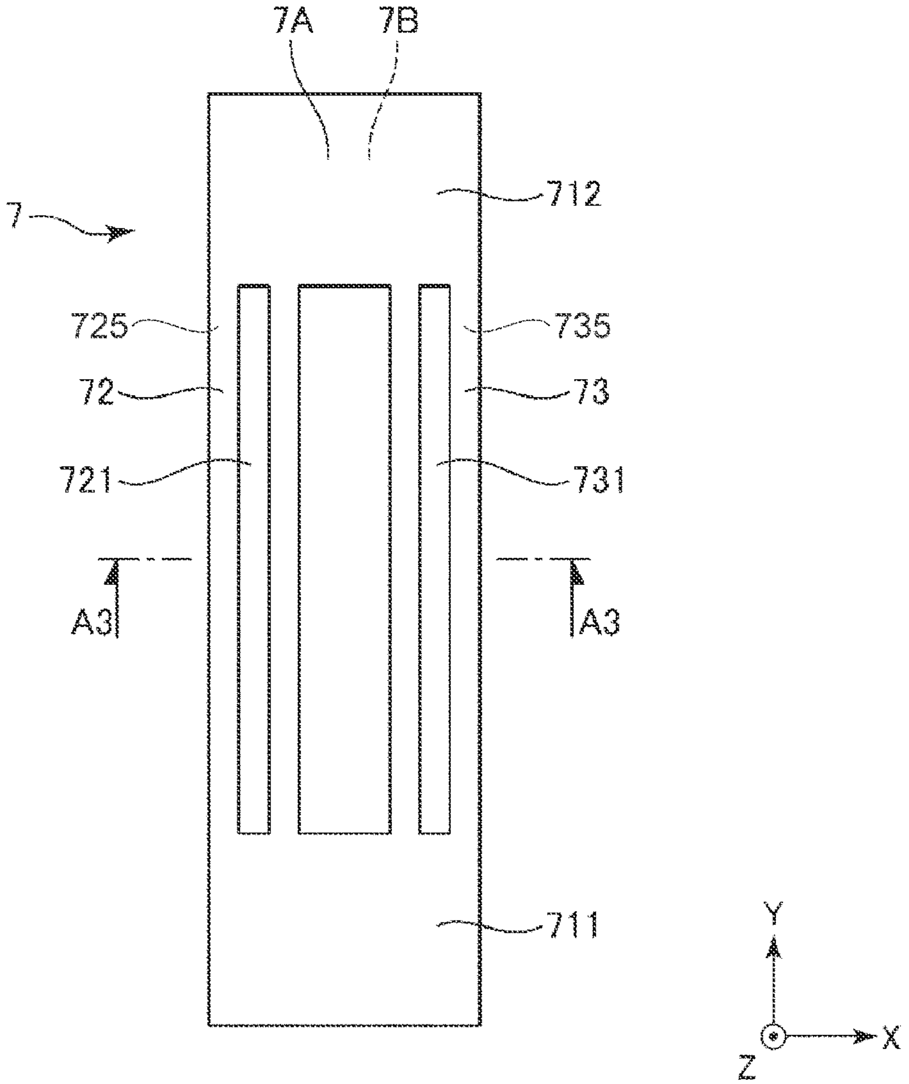
FIG. 31 is a plan view showing a vibrator element according to a modification.
Figure 32:
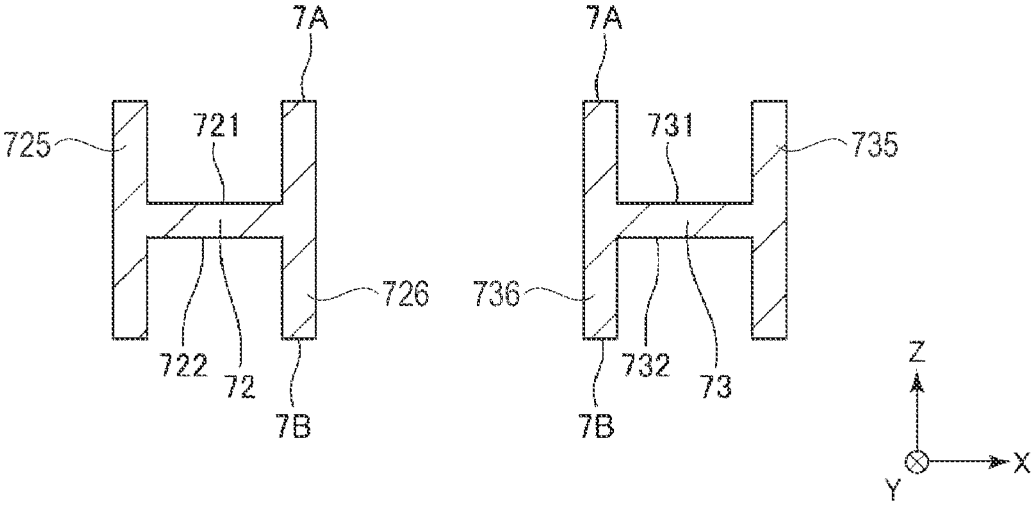
FIG. 32 is a cross sectional view taken along a line A3-A3 in FIG. 31.

The vibrator element manufactured using the method for manufacturing a vibrator element according to the present disclosure may be, for example, a double tuning fork type vibrator element 7 as shown in FIGS. 31 and 32. In FIGS. 31 and 32, electrodes are not shown. The double tuning fork type vibrator element 7 includes a pair of base portions 711 and 712, and a first vibration arm 72 and a second vibration arm 73 that couple the base portions 711 and 712. In addition, the first vibration arm 72 and the second vibration arm 73 respectively include bottomed first grooves 721 and 731 that open to a first surface 7A, bottomed second grooves 722 and 732 that open to a second surface 7B, first bank portions 725 and 735 that respectively define the first grooves 721 and 731, and second bank portions 726 and 736 that respectively define the second grooves 722 and 732.

Figure 33:
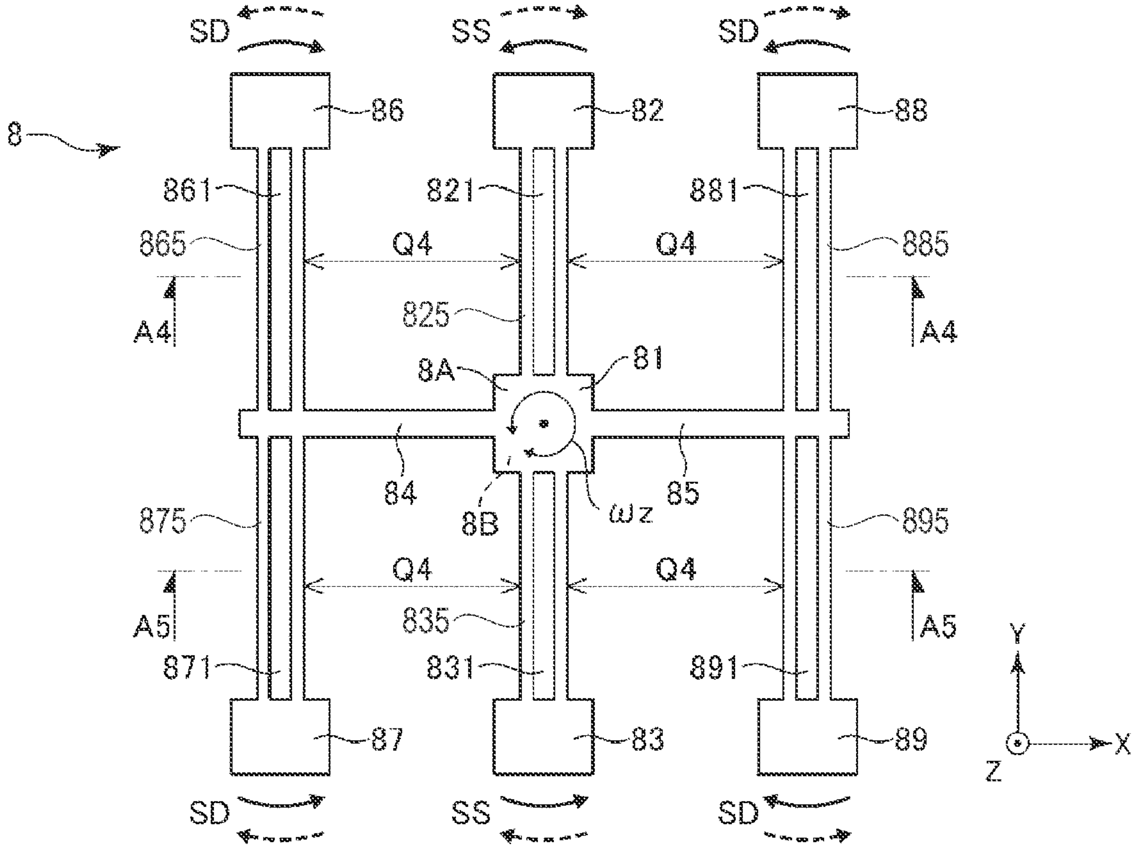
FIG. 33 is a plan view showing a vibrator element according to a modification.
Figure 34:
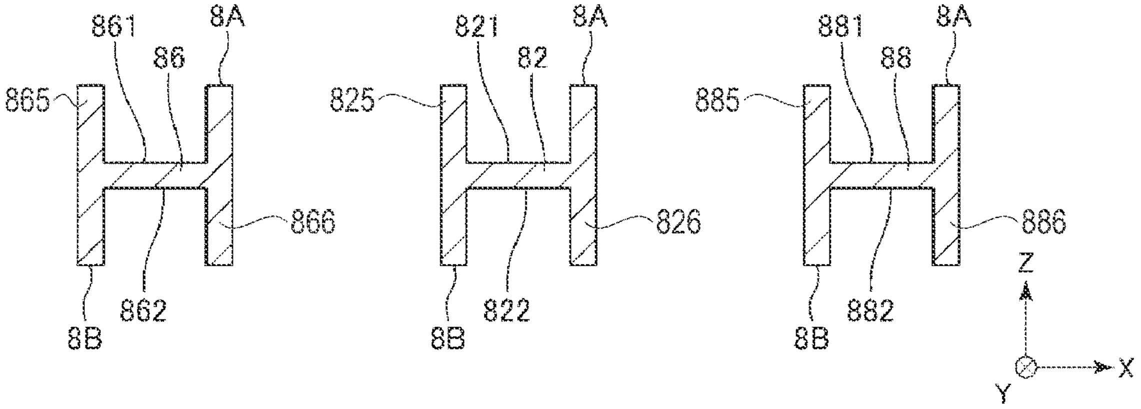
FIG. 34 is a cross sectional view taken along a line A4-A4 in FIG. 33.
Figure 35:
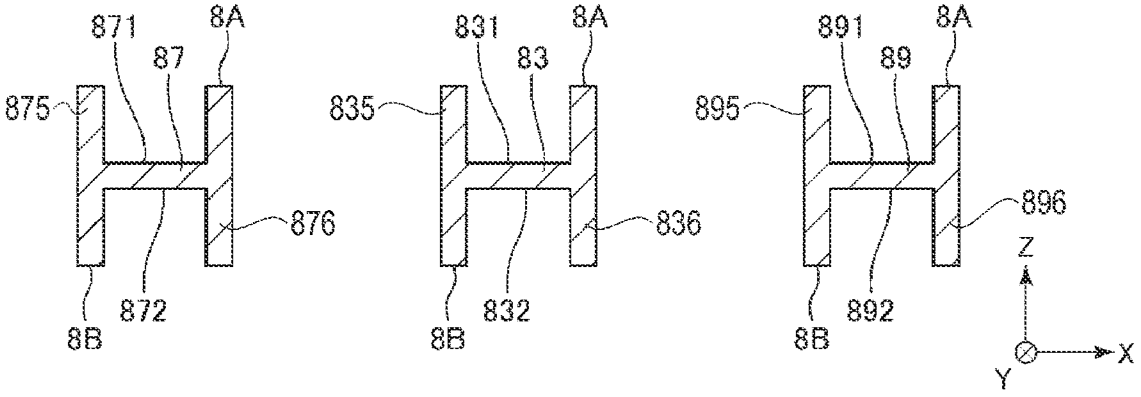
FIG. 35 is a cross sectional view taken along a line A5-A5 in FIG. 33.

For example, the vibrator element may be a gyro vibrator element 8 as shown in FIGS. 33, 34, and 35. In FIGS. 33, 34, and 35, electrodes are not shown. The gyro vibrator element 8 includes a base portion 81, a pair of detection vibration arms 82 and 83 extending from the base portion 81 to both sides of the Y direction, a pair of coupling arms 84 and 85 extending from the base portion 81 to both sides of the X direction, drive vibration arms 86 and 87 extending from a tip end portion of the coupling arm 84 to both sides of the Y direction, and drive vibration arms 88 and 89 extending from a tip end portion of the coupling arm 85 to both sides of the Y direction. In the gyro vibrator element 8, when an angular velocity ωz around the Z axis is applied in a state in which the drive vibration arms 86, 87, 88, 89 perform a flexural vibration in a direction indicated by arrows SD in FIG. 33, a flexural vibration in a direction indicated by arrows SS is newly excited in the detection vibration arms 82 and 83 by a Coriolis force, and the angular velocity ωz is detected based on electric charges output from the detection vibration arms 82 and 83 due to the flexural vibration.

The detection vibration arms 82 and 83 respectively include bottomed first grooves 821 and 831 that open in a first surface 8A, bottomed second grooves 822 and 832 that open in a second surface 8B, first bank portions 825 and 835 that respectively define the first grooves 821 and 831, and second bank portions 826 and 836 that respectively define the second grooves 822 and 832. The drive vibration arms 86, 87, 88, and 89 respectively include bottomed first grooves 861, 871, 881, and 891 that open to the first surface 8A, bottomed second grooves 862, 872, 882, and 892 that open to the second surface 8B, first bank portions 865, 875, 885, and 895 that respectively define the first grooves 861, 871, 881, and 891, and second bank portions 866, 876, 886, and 896 that respectively define the second grooves 862, 872, 882, and 892. In the gyro vibrator element 8, for example, the drive vibration arms 86 and 88 or the drive vibration arms 87 and 89 respectively serve as the first vibration arms and the second vibration arms.

Figure 36:
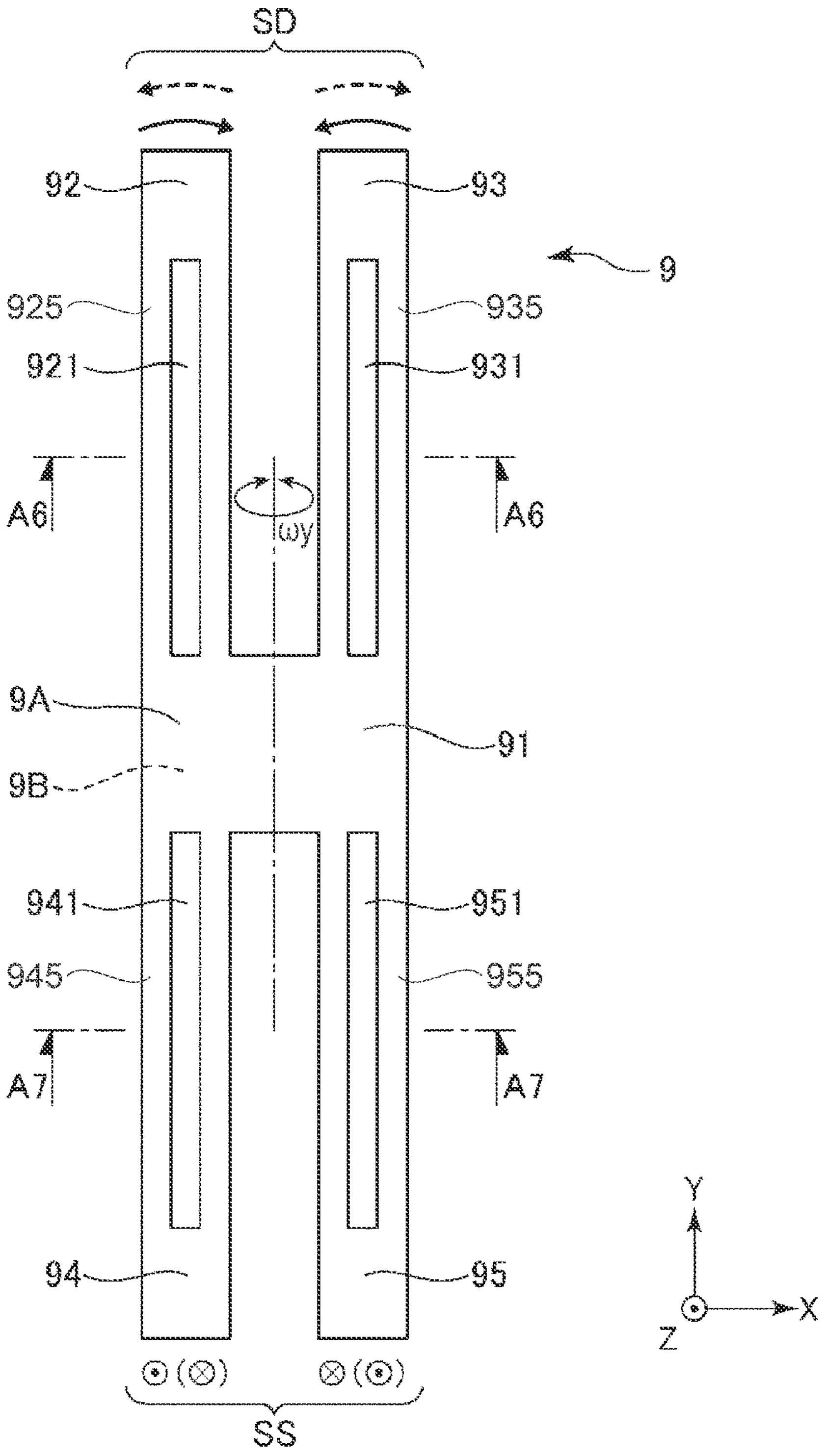
FIG. 36 is a plan view showing a vibrator element according to a modification.
Figure 37:
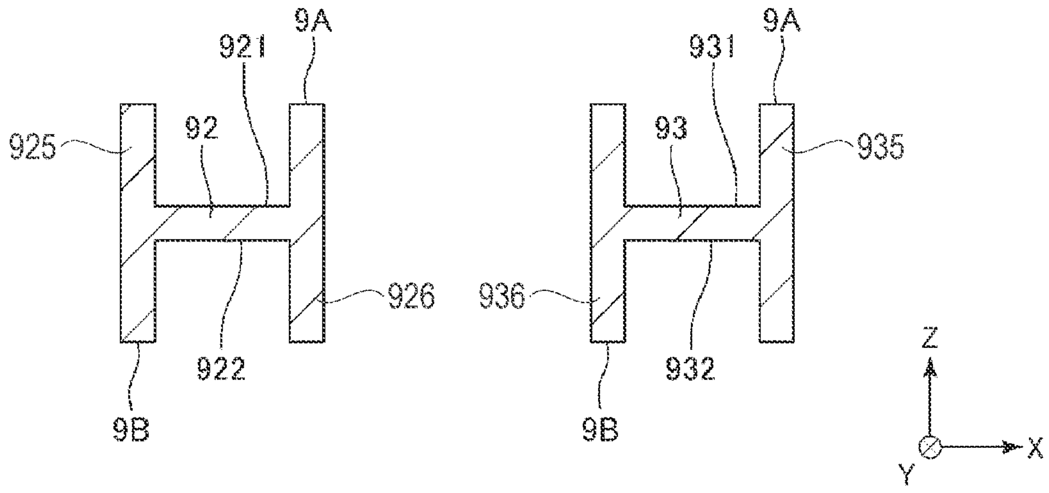
FIG. 37 is a cross sectional view taken along a line A6-A6 in FIG. 36.
Figure 38:
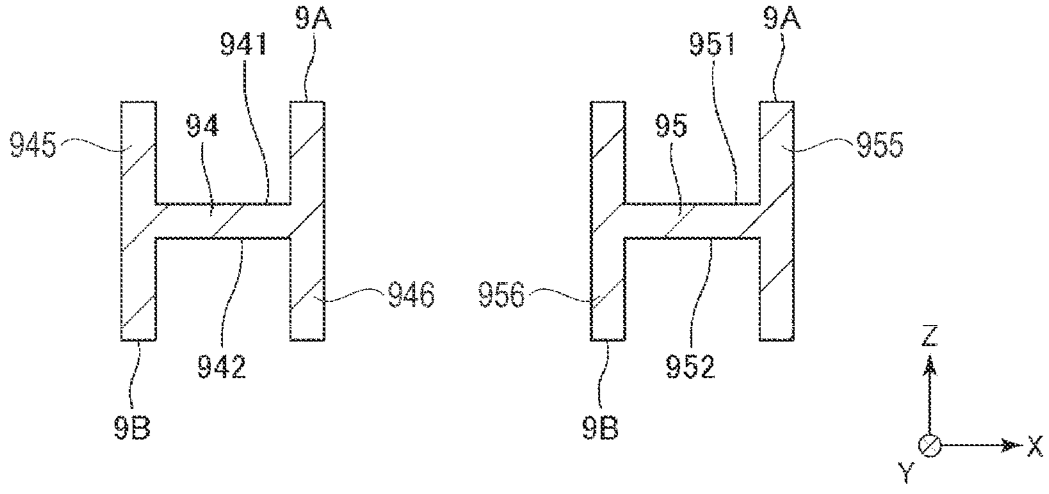
FIG. 38 is a cross sectional view taken along a line A7-A7 in FIG. 36.

The vibrator element may be a gyro vibrator element 9 as shown in FIGS. 36, 37, and 38. In FIGS. 36, 37, and 38, electrodes are not shown. The gyro vibrator element 9 includes a base portion 91, a pair of drive vibration arms 92 and 93 that extend from the base portion 91 to the positive side of the Y direction and are arranged in the X direction, and a pair of detection vibration arms 94 and 95 that extend from the base portion 91 to the negative side of the Y direction and are arranged in the X direction. In the gyro vibrator element 9, when an angular velocity ωy around the Y axis is applied in a state in which the drive vibration arms 92 and 93 perform a flexural vibration in a direction indicated by arrows SD in FIG. 36, a flexural vibration in a direction indicated by arrows SS is newly excited in the detection vibration arms 94 and 95 by a Coriolis force, and the angular velocity ωy is detected based on electric charges output from the detection vibration arms 94 and 95 due to the flexural vibration.

The drive vibration arms 92 and 93 respectively include bottomed first grooves 921 and 931 that open to a first surface 9A, bottomed second grooves 922 and 932 that open to a second surface 9B, first bank portions 925 and 935 that respectively define the first grooves 921 and 931, and second bank portions 926 and 936 that respectively define the second grooves 922 and 932. The detection vibration arms 94 and 95 respectively include bottomed first grooves 941 and 951 that open to the first surface 9A, bottomed second grooves 942 and 952 that open to the second surface 9B, first bank portions 945 and 955 that respectively define the first grooves 941 and 951, and second bank portions 946 and 956 that respectively define the second grooves 942 and 952. In the gyro vibrator element 9, the drive vibration arms 92 and 93 or the detection vibration arms 94 and 95 respectively serve as the first vibration arms and the second vibration arms.

What is claimed is:

1. A method for manufacturing a vibrator element which includes a first vibration arm and a second vibration arm that extend along a first direction and that are arranged side by side along a second direction intersecting the first direction, and in which the first vibration arm and the second vibration arm each have a first surface and a second surface that are arranged opposite to each other in a third direction intersecting the first direction and the second direction, a bottomed first groove that opens to the first surface, a bottomed second groove that opens to the second surface, the method comprising:

providing a quartz crystal substrate having a first substrate surface and a second substrate surface that are in a front and back relationship;

forming a first protective film on the first substrate surface;

conducting first dry etching of the first substrate surface of the quartz crystal substrate through the first protective film, to simultaneously form the first surface of the first and second vibration arms, the first bottomed grooves, and outer shapes of the first vibration arm and the second vibration arm;

after conducting the first dry etching, forming a second protective film on the second substrate surface; and after conducting the first dry etching and after forming the second protective film, conducting second dry etching of the second substrate surface of the quartz crystal substrate through the second protective film, to simultaneously form the second surface of the first and second vibration arms, the second bottomed grooves, and the outer shapes of the first vibration arm and the second vibration arm, wherein in the first dry etching, the outer shapes of the first vibration arm and the second vibration arm are formed to be closer to the second substrate surface in the third direction than positions where bottom surfaces of the second bottomed grooves are formed in the second dry etching, and in the second dry etching, an etching depth in second groove forming regions is substantially equal to an etching depth in an inter-arm region located between a first vibration arm forming region in which the first vibration arm is formed and a second vibration arm forming region in which the second vibration arm is formed, such that overlap between the outer shapes formed in the first dry etching and the outer shapes formed in the second dry etching results in penetration of the inter-arm region.

2. The method for manufacturing a vibrator element according to claim 1, wherein the first protective film satisfies a relationship $T1<T2<T3$, wherein T1 is a thickness of the first protective film along the third direction in the inter-arm region, T2 is a thickness of the first protective film along the third direction in a first groove forming region in which the first bottomed grooves are to be formed, and T3 is a thickness of the first protective film along the third direction in regions of the first vibration arm forming region and the second vibration arm forming region excluding the first groove forming region.

3. The method for manufacturing a vibrator element according to claim 2, wherein in the first protective film, $T1=0$.

4. The method for manufacturing a vibrator element according to claim 1, wherein the first protective film includes an underlayer film and a third protective film, and the forming of the first protective film includes forming the underlayer film on the first substrate surface in a first vibration arm forming region in which the first vibration arm is to be formed and a second vibration arm forming region in which the second vibration arm is to be formed, and forming the third protective film on the underlayer film in a region excluding first groove forming regions in which the first bottomed grooves are to be formed.

5. The method for manufacturing a vibrator element according to claim 4, wherein the underlayer film is not formed in an inter-arm region located between the first vibration arm forming region and the second vibration arm forming region of the first substrate surface.

6. The method for manufacturing a vibrator element according to claim 1, further comprising:

removing, after the first dry etching is ended in a state in which the first protective film remains on the first substrate surface, the remained first protective film.

7. The method for manufacturing a vibrator element according to claim 6, further comprising:

removing, after the second dry etching is ended in a state in which the second protective film remains on the second substrate surface, the remained second protective film.

* * * * *